United States Patent
Pan

(10) Patent No.: US 12,557,622 B2
(45) Date of Patent: Feb. 17, 2026

(54) METHOD FOR FABRICATING A SEMICONDUCTOR DEVICE WITH A COMPOSITE BARRIER STRUCTURE

(71) Applicant: NANYA TECHNOLOGY CORPORATION, New Taipei (TW)

(72) Inventor: Wei-Chen Pan, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 623 days.

(21) Appl. No.: 17/708,161

(22) Filed: Mar. 30, 2022

(65) Prior Publication Data

US 2023/0317514 A1   Oct. 5, 2023

(51) Int. Cl.
| | |
|---|---|
| *H01L 21/768* | (2006.01) |
| *C11D 3/00* | (2006.01) |
| *H01L 23/522* | (2006.01) |
| *H01L 23/528* | (2006.01) |
| *H01L 23/532* | (2006.01) |

(52) U.S. Cl.
CPC ...... *H01L 21/76814* (2013.01); *C11D 3/0073* (2013.01); *H01L 21/76846* (2013.01); *H01L 23/5226* (2013.01); *H01L 23/5283* (2013.01); *H01L 23/53238* (2013.01); *C11D 2111/22* (2024.01)

(58) Field of Classification Search
CPC ......... H01L 21/76814; H01L 21/76846; H01L 21/02063; H01L 21/76877; H01L 21/76807; H01L 21/76858; H01L 23/76843; H01L 21/02068; H01L 23/5226; H01L 23/5283; H01L 23/53238; H01L 2221/1021; C11D 3/0073; C11D 2111/22; G03F 1/50; G03F 1/0037; B08B 3/08

See application file for complete search history.

(56) References Cited

U.S. PATENT DOCUMENTS

| | | | |
|---|---|---|---|
| 2002/0102852 A1* | 8/2002 | Verhaverbeke | ... H01L 21/67051 257/E21.228 |
| 2003/0134508 A1* | 7/2003 | Raaijmakers | ..... H01L 21/76825 257/E21.171 |

(Continued)

FOREIGN PATENT DOCUMENTS

| | | | |
|---|---|---|---|
| TW | 200505975 A | 2/2005 | |
| TW | 201244006 A | 11/2012 | |
| WO | WO-2022024714 A1 * | 2/2022 | ............... C11D 1/34 |

OTHER PUBLICATIONS

Office Action mailed on May 22, 2023 related to Taiwanese Application No. 111121042.

*Primary Examiner* — Wael M Fahmy
*Assistant Examiner* — Tiberiu Dan Onuta
(74) *Attorney, Agent, or Firm* — Xuan Zhang

(57) ABSTRACT

The present application discloses a semiconductor device with a composite barrier structure and a method for fabricating the semiconductor device. The semiconductor device includes a substrate; a first dielectric layer having a feature opening on a substrate; a composite barrier structure in the feature opening, wherein the composite barrier structure includes a barrier layer in the feature opening and an assisting blocking layer on the barrier layer; and a conductive feature on the assisting blocking layer; wherein the barrier layer comprises tantalum, and the assisting blocking layer comprises copper manganese alloy.

12 Claims, 22 Drawing Sheets

(56) References Cited

U.S. PATENT DOCUMENTS

| | | | |
|---|---|---|---|
| 2005/0112899 A1* | 5/2005 | Shim | H01L 21/76807 |
| | | | 257/E21.252 |
| 2005/0236362 A1* | 10/2005 | Aoki | C11D 7/08 |
| | | | 252/79.3 |
| 2005/0239672 A1* | 10/2005 | Mun | C11D 1/72 |
| | | | 257/E21.228 |
| 2012/0252206 A1* | 10/2012 | Naik | H01L 21/76885 |
| | | | 438/653 |
| 2013/0040440 A1* | 2/2013 | Adam | H01L 21/02529 |
| | | | 257/E21.09 |
| 2014/0299163 A1* | 10/2014 | Ishibashi | H01L 21/67051 |
| | | | 134/33 |
| 2016/0276272 A1* | 9/2016 | Chen | H01L 23/53295 |
| 2019/0295887 A1* | 9/2019 | Trickett | H01L 21/67276 |
| 2019/0348322 A1* | 11/2019 | Mullick | H01L 21/76807 |
| 2022/0238323 A1* | 7/2022 | Clark | H01L 21/76832 |
| 2022/0238466 A1* | 7/2022 | Tsai | H01L 21/76832 |
| 2022/0243150 A1* | 8/2022 | Wang | C11D 7/263 |

\* cited by examiner

METHOD FOR FABRICATING A SEMICONDUCTOR DEVICE WITH A COMPOSITE BARRIER STRUCTURE

TECHNICAL FIELD

The present disclosure relates to a semiconductor device a method for fabricating the same, and more particularly, to a semiconductor device with a composite barrier structure and a method for fabricating the same.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device with a composite barrier structure. The semiconductor device includes a substrate; a first dielectric layer having a feature opening on a substrate; a composite barrier structure in the feature opening, wherein the composite barrier structure includes a barrier layer in the feature opening and an assisting blocking layer on the barrier layer; and a conductive feature on the assisting blocking layer; wherein the barrier layer comprises tantalum, and the assisting blocking layer comprises copper manganese alloy Another aspect of the present disclosure provides a method for fabricating a semiconductor device including forming a first dielectric layer on a substrate; forming a feature opening to exposing the substrate; performing a pre-cleaning treatment including a pre-cleaning solution to the feature opening; performing a cleaning process to the feature opening; conformally forming a barrier layer in the feature opening; conformally forming an assisting blocking layer on the barrier layer; and forming a conductive feature on the assisting blocking layer. The pre-cleaning solution includes a chelating agent and a corrosion inhibitor. The barrier layer includes tantalum. The assisting blocking layer includes copper manganese alloy.

Due to the design of the method for fabricating the semiconductor device of the present disclosure, the underlying conductive layer exposed through the feature opening may be protected by the chelating agent(s) and/or the corrosion inhibitor(s) contained in the pre-cleaning solution. As a result, the profile defects or electron migration may be reduced or avoided. Accordingly, the yield and the reliability of the resulting semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
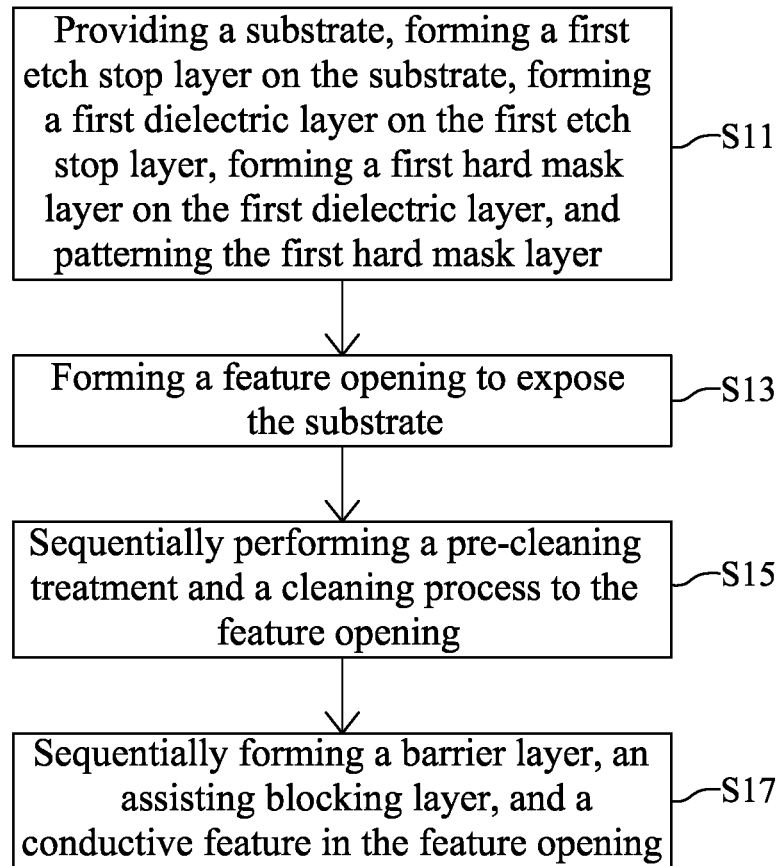
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that the terms "forming," "formed" and "form" may mean and include any method of creating, building, patterning, implanting, or depositing an element, a dopant, or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching, and wet etching.

It should be noted that, in the description of the present disclosure, the functions or steps noted herein may occur in an order different from the order noted in the figures. For example, two figures shown in succession may in fact be executed substantially concurrently or may sometimes be executed in a reversed order, depending upon the functionalities or steps involved.

FIG. 1 illustrates, in a flowchart diagram form, a method 10 for fabricating a semiconductor device 1A in accordance with one embodiment of the present disclosure. FIGS. 2 to 8 illustrate, in schematic cross-sectional view diagrams, a flow for fabricating the semiconductor device 1A in accordance with one embodiment of the present disclosure.

Figure 2:
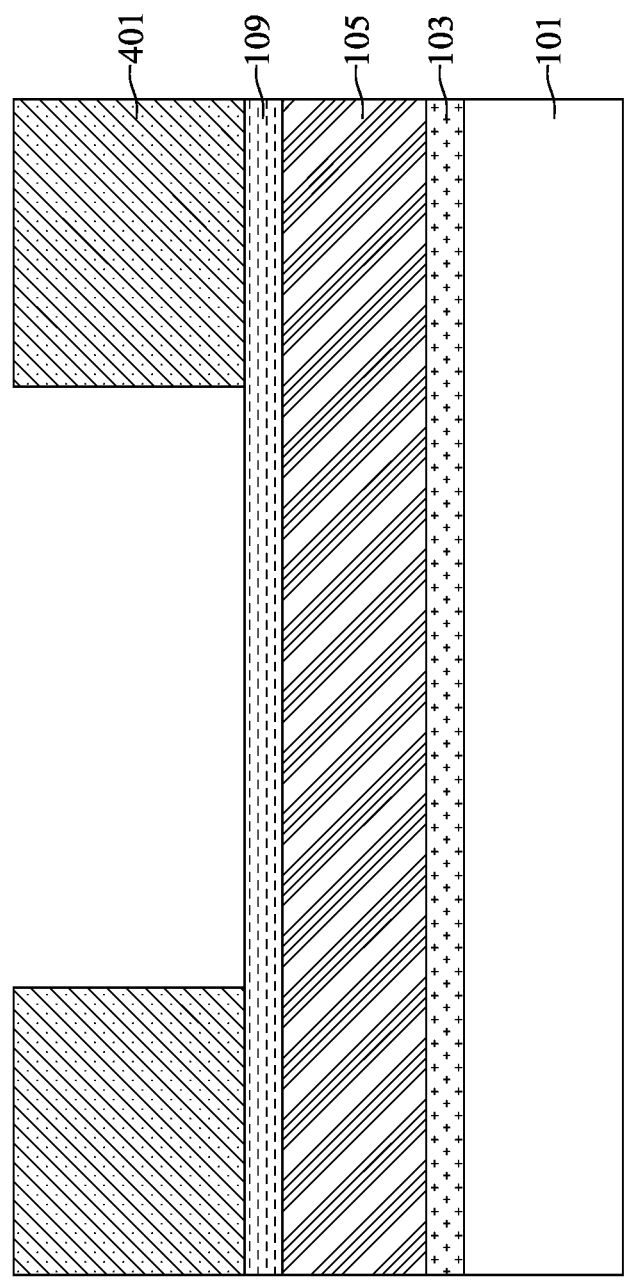
FIGS. 2 to 8 illustrate, in schematic cross-sectional view diagrams, a flow for fabricating the semiconductor device in accordance with one embodiment of the present disclosure.
Figure 3:
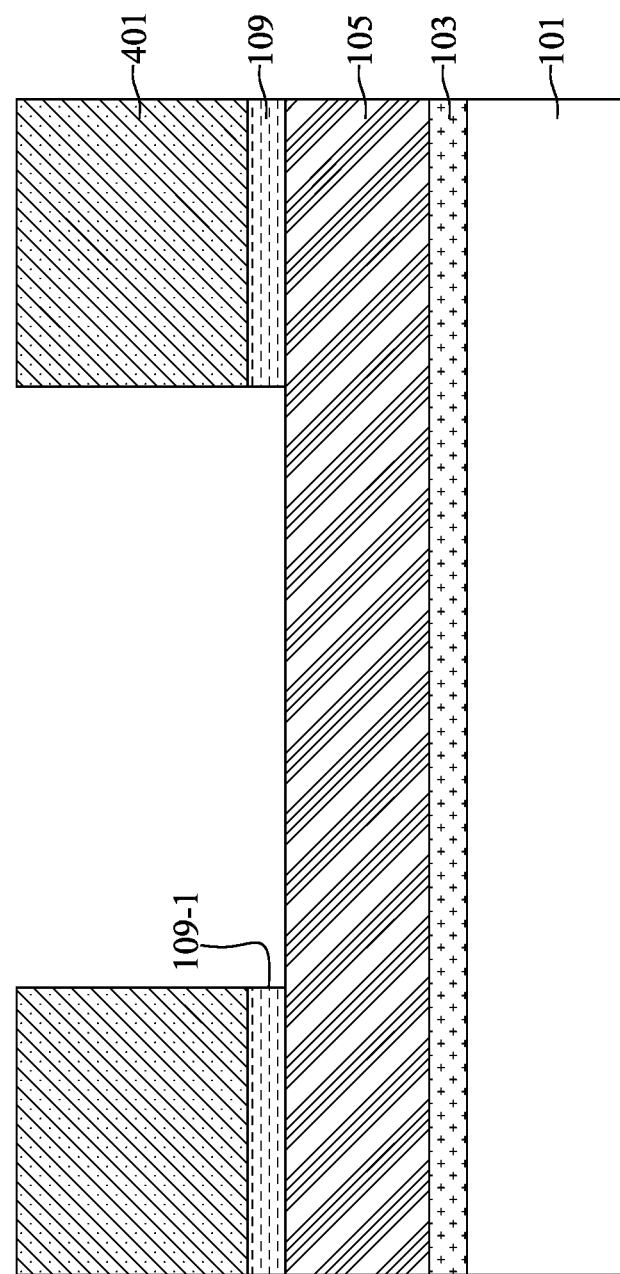

With reference to FIGS. 1 to 3, at step S11, a substrate 101 may be provided, a first etch stop layer 103 may be formed on the substrate 101, a first dielectric layer 105 may be formed on the first etch stop layer 103, a first hard mask layer 109 may be formed on the first dielectric layer 105, and the first hard mask layer 109 may be patterned to form a hard mask opening 109-1.

With reference to FIG. 2, the substrate 101 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5.

In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, the first etch stop layer 103 may be formed on the substrate 101. The first etch stop layer 103 may be preferably formed of a dielectric material having a different etch selectivity from the topmost layer of the substrate 101 (e.g., the dielectric layer). For example, the first etch stop layer 103 may be formed of silicon nitride, silicon carbonitride, silicon oxycarbide, or the like, and may be deposited by chemical vapor deposition or plasma enhanced chemical vapor deposition.

With reference to FIG. 2, the first dielectric layer 105 may be formed on the first etch stop layer 103 and may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 105 may include a self-planarizing material such as a spin-on glass or a spin-on low-k dielectric material such as SiLK™. The use of a self-planarizing dielectric material may avoid the need to perform a subsequent planarizing step. In some embodiments, the first dielectric layer 105 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

When low-k material has been used for dielectric layers (e.g., the first dielectric layer 105), it has been difficult to produce features with little or no surface defects or feature deformation. It has been observed that low-k dielectric materials are often porous and susceptible to being scratched and damaged during processing, which results in defects being formed on the surface thereof. Further, low-k materials are often brittle and may deform under conventional polishing processes. One solution to limiting or reducing surface defects and deformation is to deposit a hard mask layer over the exposed low-k materials prior to patterning and etching feature definitions in the low-k materials. The hard mask layer may be resistive to damage and deformation. The hard mask layer may also protect the underlying low-k materials during subsequent material deposition and planarization or material removal processes, such as chemical mechanical polishing techniques or etching techniques, thereby reducing defect formation and feature deformation. The hard mask layer may then be removed by a following planarization process prior to subsequent processes.

With reference to FIG. 2, the first hard mask layer 109 may be formed on the first dielectric layer 105. In some embodiments, the first hard mask layer 109 may be formed of, for example, silicon, silicon germanium, tetraethyl orthosilicate, silicon nitride, silicon oxynitride, silicon nitride oxide, silicon carbide, the like, or a combination thereof. The first hard mask layer 109 may be formed by a deposition process such as chemical vapor deposition, plasma-enhanced chemical vapor deposition, atomic layer deposition, or the like. The process temperature of forming the first hard mask layer 109 may be less than 400° C.

Alternatively, in some embodiments, the first hard mask layer 109 may be formed of, for example, boron nitride, silicon boron nitride, phosphorus boron nitride, boron carbon silicon nitride, or the like. The first hard mask layer 109 may be formed by a film formation process and a treatment process. Detailedly, in the film formation process, first precursors, which may be boron-based precursors, may be introduced over the first dielectric layer 105 to form a boron-based layer. Subsequently, in the treatment process, second precursors, which may be nitrogen-based precursors, may be introduced to react with the boron-based layer and turn the boron-based layer into the first hard mask layer 109. In some embodiments, the first precursors may be, for example, diborane, borazine, or an alkyl-substituted derivative of borazine. In some embodiments, the second precursors may be, for example, ammonia or hydrazine.

With reference to FIG. 2, a first mask layer 401 may be formed on the first hard mask layer 109. The first mask layer 401 may be, for example, a photoresist layer. The first mask layer 401 may be patterned to define the positions of the feature opening 105-1 as will be illustrated later. During the patterning of the first mask layer 401, the first hard mask layer 109 may serve as an anti-reflection coating to improve the quality of image transferring from a photomask (not shown) to the first hard mask layer 109.

With reference to FIG. 3, a hard mask etch process may be performed to remove portions of the first hard mask layer 109 and the pattern of the first mask layer 401 may be transferred to the first hard mask layer 109 to form a hard mask opening 109-1 along the first hard mask layer 109. The etch rate of the first hard mask layer 109 of the hard mask etch process may be faster than the etch rate of the first dielectric layer 105 of the hard mask etch process. For example, the etch rate ratio of the first hard mask layer 109 to the first dielectric layer 105 may be between about 100:1 and about 1.05:1 during the hard mask etch process. For another example, the etch rate ratio of the first hard mask layer 109 to the first dielectric layer 105 may be between about 100:1 and about 10:1 during the hard mask etch process. The first dielectric layer 105 may be exposed through the hard mask opening 109-1.

Figure 4:
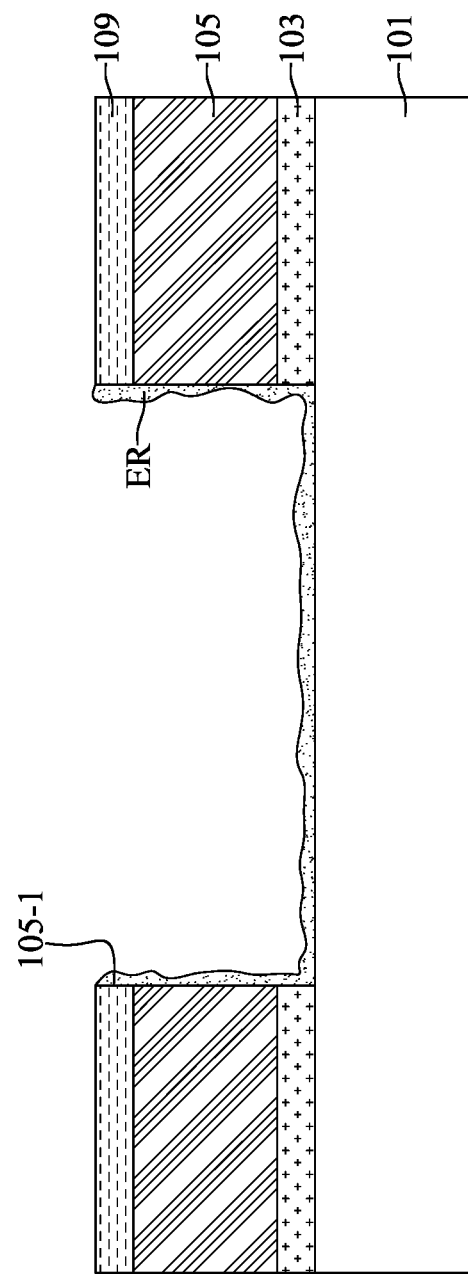

With reference to FIGS. 1 and 4, at step S13, the feature opening 105-1 may be formed to expose the substrate 101.

With reference to FIG. 4, an etching process may be performed using the first hard mask layer 109 and/or the first mask layer 401 as the mask to remove portions of the first dielectric layer 105 and portions of the first etch stop layer 103. The etching process may include multiple stages such as two stages. For example, the etch rate ratio of the first dielectric layer 105 to the first hard mask layer 109 may be between about 100:1 and about 1.05:1 or between about 100:1 and about 10:1 during the first stage of the etching process. The etch rate ratio of the first dielectric layer 105 to the first etch stop layer 103 may be between about 100:1 and about 1.05:1 or between about 100:1 and about 10:1 during the first stage of the etching process. The etch rate ratio of the first etch stop layer 103 to the first hard mask layer 109 may be between about 100:1 and about 1.05:1 or between about 100:1 and about 10:1 during the second stage of the etching process. The etch rate ratio of the first etch stop layer 103 to the substrate 101 may be between about 100:1 and about 1.05:1 or between about 100:1 and about 10:1 during the second stage of the etching process. After the etching process, the feature opening 105-1 may be formed along the first dielectric layer 105 and the first etch stop layer 103.

In some embodiments, the first mask layer 401 may be removed before the formation of the feature opening 105-1. In some embodiments, the first mask layer 401 may be removed after the etching process for forming the feature opening 105-1. The removal of the first mask layer 401 may be achieved by an ashing process or other applicable processes. Some etching residue ER may be left after the removal of the first mask layer 401. The etching residue ER may be the remaining substance on the inner surface of the feature opening 105-1 after the etching process of the feature opening 105-1 or after the ashing process. For example, the etching residue ER may be an incompletely ashed substance remaining on the inner surface of the feature opening 105-1 after the ashing process, a polymer remaining on the inner surface of the feature opening 105-1 as a by-product (also called a side wall protecting film or a rabbit ear), and/or an organometallic polymer and a metal oxide remaining on the inner surface of the feature opening 105-1. Accordingly, the etching residue ER may have different constitutions depending on the material to be etched or ashed.

Figure 5:
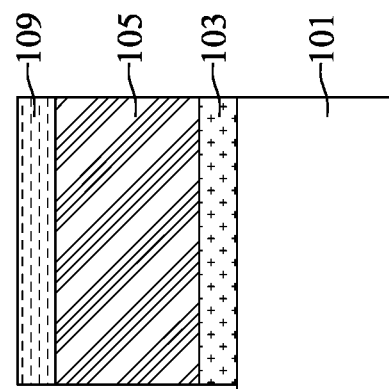
Figure 5:
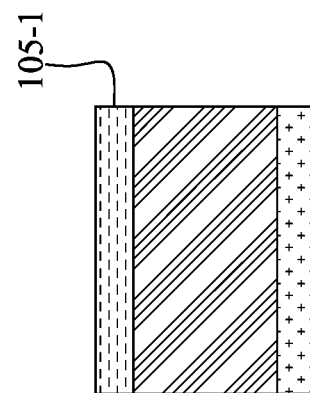

With reference to FIG. 5, at step S15, a pre-cleaning treatment and a cleaning process may be sequentially performed to the feature opening 105-1.

With reference to FIG. 5, during the pre-cleaning treatment, the intermediate semiconductor device illustrated in FIG. 4 may be spun at a rate between about 10 rpm and about 2000 rpm or between about 100 rpm and 1000 rpm. A pre-cleaning solution may be sprayed onto the intermediate semiconductor device to cover the entire front side of the intermediate semiconductor device. Simultaneously to applying the pre-cleaning solution onto the front side of the intermediate semiconductor device, water or other suitable solution may be applied to the backside of the intermediate semiconductor device to clean the backside of the intermediate semiconductor device.

In some embodiments, the pre-cleaning solution may include chelating agent(s), corrosion inhibitor(s), amine fluoride, surfactant(s), or solvent. In some embodiments, the amine fluoride and the surfactant(s) may be optional.

Generally, the chelating agent(s) may be also known as complexing or sequestering agent(s). The chelating agent(s) may have negatively charged ions called ligands that bind with free metal ions and form a combined complex that remain soluble. The chelating agent(s) may be used to remove metallic ions from the intermediate semiconductor device. It is not bound to any particular theory, the chelating agent(s) may also reduce or avoid the underlying conductive layer exposed through the feature opening 105-1 being corroded.

In some embodiments, the chelating agent(s) of the pre-cleaning solution may include ethylenediaminetetraacetic acid, polyacrylates, carbonates, phosphonates, gluconates, N,N'-bis(2-hydroxyphenyl)ethylenediiminodiacetic acid, triethylenetetranitrilohexaacetic acid, desferriferrioxamin B, N,N',N"-tris [2-(N-hydroxycarbonyl)ethyl]-1,3,5-benzenetricarboxamide, and/or ethylenediaminediorthohydroxyphenylacetic acid. In some embodiments, the concentration of the chelating agent(s) may be between about 0.001 mg/L and about 300 mg/L or between about 0.01 mg/L and about 3 mg/L. In some embodiments, alternatively, the concentration of the chelating agent(s) may be between 1 ppm and about 400 ppm of the pre-cleaning solution or preferably about 40 ppm of the pre-cleaning solution.

The corrosion inhibitor(s) of the pre-cleaning solution may be provided to reduce or avoid the metal corrosion during the following cleaning process. In some embodiments, the corrosion inhibitor(s) may include an aliphatic alcohol compound having at least one mercapto group in the molecule. The number of carbon atoms constituting said alcohol compound is not less than 2, and a carbon atom bonded with a mercato group, and another carbon atom bonded with a hydroxyl group are contiguously bonded with each other. For example, the corrosion inhibitor(s) may be 2-mercaptoethanol and/or thioglycerol. In some embodiments, the concentration of the corrosion inhibitor(s) in the pre-cleaning solution may be between about 0.0001% and about 10% by weight or between about 0.001% and about 1% by weight. When the concentration is too low, the corrosion inhibiting effect may be limited to an unsatisfactory degree. Whereas too high concentration may not always give a further increased corrosion inhibiting effect and moreover may make difficult to handle it due to the odor peculiar to mercapto group-carrying compounds.

Alternatively, in some embodiments, the corrosion inhibitor(s) of the pre-cleaning solution may include aromatic hydrocarbon compounds such as benzotriazole and/or 5-methylbenzimidazole. Alternatively, in some embodiments, the corrosion inhibitor(s) of the pre-cleaning solution may include uric acid, adenine, caffeine, and/or purine. Alternatively, in some embodiments, the corrosion inhibitor (s) of the pre-cleaning solution may include glyoxylic. Due to the presence of glyoxylic acid, which is a reducing material, even if a metal material is exposed during the pre-cleaning treatment, by controlling the redox potential of the pre-cleaning solution by adjusting the concentration of glyoxylic acid therein, electron transfer between the pre-cleaning solution and the exposed metal material is controlled, and corrosion of the metal material is prevented. Alternatively, in some embodiments, the corrosion inhibitor (s) of the pre-cleaning solution may include 2-mercaptoethanol, thioglycerol, benzotriazole, 5-methylbenzimidazole, uric acid, adenine, caffeine, purine, and/or glyoxylic acid.

In some embodiments, the amine fluoride of the pre-cleaning solution may include methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and/or triethylenediamine hydrofluoride. The amine fluoride may be used to remove the etching residue ER.

In some embodiments, the concentration of the amine fluoride in the pre-cleaning solution may be determined according to the composition of the etching residue ER. For example, the concentration of the amine fluoride may be between about 0.1 mass % and about 5 mass % of the entire composition of the pre-cleaning solution, or between about 0.2 mass % and about 3 mass % of the entire composition of the pre-cleaning solution. By setting the concentration of the amine fluoride in such a range, it is possible to ensure that the amine fluoride in the pre-cleaning solution is capable of removing the etching residue ER, while preventing the amine fluoride from corroding underlying metal material exposed through the feature opening 105-1 and suppressing etching of underlying dielectric layer exposed through the feature opening 105-1. That is, if the concentration of the amine fluoride in the pre-cleaning solution is too low, the ability to remove a residue is low, and if the concentration is too high, the metal material may be corroded, and the exposed dielectric layer may be etched or undergo structural change.

The purpose of the surfactant(s) may be to prevent reattachment or redeposition of particles on the intermediate semiconductor device after they have been dislodged from the intermediate semiconductor device. Preventing the reattachment of the particles is important because allowing the particles to reattach increases overall process time. The purpose of the surfactant(s) may also include imparting affinity toward a water-repellent material layer. Generally, surfactant(s) are long hydrocarbon chains that typically contain a hydrophilic (polar water-soluble group) and a hydrophobic group (a non-polar water-insoluble group). The surfactant(s) attach with their non-polar group to particles as well as to the front side of the intermediate semiconductor device. As a result, the polar group of the surfactant(s) will point away from the wafer and away from the particles towards the pre-cleaning solution covering the front side of the intermediate semiconductor device. Because of this the particles in the solution that are bound by the surfactant will be repelled electrostatically from the front side of the intermediate semiconductor device due to the polar groups of the surfactant(s) on both the particles and the front side of the intermediate semiconductor device.

In some embodiments, the surfactant(s) of the pre-cleaning solution may include non-ionic, anionic, or a mixture of non-ionic and anionic compounds. Non-ionic means that the polar end of the surfactant has an electrostatic rather than an ionic charge and anionic means that the polar end of the surfactant has a negative ionic charge.

The nonionic surfactant may be, for example, polyoxyethylene butylphenyl ether and the anionic surfactant may be, for example, polyoxyethylene alkylphenyl sulfate. In some embodiments, the concentration of the surfactant(s) of the pre-cleaning solution may be between about 1 ppm and about 100 ppm. In some embodiments, the concentration of the non-ionic surfactant(s) in the pre-cleaning solution may be about 30 ppm and the concentration of the anionic surfactant(s) in the pre-cleaning solution may be about 30 ppm. In some embodiments, the concentration of the surfactant(s) of the pre-cleaning solution may be between 0.0001 mass % and 10 mass % of the entire composition of the pre-cleaning solution, or between about 0.001 mass % and about 5 mass % of the entire composition of the pre-cleaning solution. By setting the concentration in such a range, it is possible to ensure that the wettability toward the front side of the intermediate semiconductor device is commensurate with the concentration of the surfactant(s).

In some embodiments, the solvent of the pre-cleaning solution may be deionized water.

In some embodiments, the front side of the intermediate semiconductor device illustrated in FIG. 4 may be covered (or immersed) by the pre-cleaning solution for about 2 minutes. Next, the intermediate semiconductor device may be rinsed using deionized water to remove the pre-cleaning solution.

In some embodiments, a drying process may be performed after the pre-cleaning treatment. The drying process may be performed by spinning between about 100 rpm and about 6000 rpm, or about 3000 rpm, for about 20 seconds and using the air flow to dry the intermediate semiconductor device. In some embodiments, nitrogen or isopropyl alcohol may be used to facilitate the dry process. In some embodiments, the dry process may be optional. That is, the cleaning process may be directly performed after the rinsing of the pre-cleaning solution.

In some embodiments, the cleaning process may include three stages with inter-stage rinses between stages. Detailedly, during the first stage of the cleaning process, a first cleaning solution may be applied to the intermediate semiconductor device after the pre-cleaning treatment (or the drying process). The first cleaning solution may be rinsed by the first inter-stage rinse. During the second stage of the cleaning process, a second cleaning solution may be applied to the intermediate semiconductor device and the second cleaning solution may be subsequently rinsed by a second inter-stage rinse. During the third stage of the cleaning process, a third cleaning solution may be applied to the intermediate semiconductor device and then be rinsed by a post-stage rinse.

In some embodiments, during the first stage of the cleaning process, the intermediate semiconductor device after the pre-cleaning treatment may be spun at a rate between about 10 rpm and about 2000 rpm or between about 100 rpm and 1000 rpm. The first cleaning solution may be sprayed onto the intermediate semiconductor device to cover the entire front side of the intermediate semiconductor device. Simultaneously to applying the first cleaning solution onto the front side of the intermediate semiconductor device, water or other suitable solution may be applied to the backside of the intermediate semiconductor device to clean the backside of the intermediate semiconductor device.

In some embodiments, the first cleaning solution may include diluted hydrofluoric acid. The concentration of the first cleaning solution may be between about 5 parts deionized water to one part hydrofluoric acid and about 1000 parts deionized water to one part hydrofluoric acid, about 300 parts deionized water to one part hydrofluoric acid, or about 50 parts deionized water to one part hydrofluoric acid. Generally, the front side of the intermediate semiconductor device may be exposed to the first cleaning solution for a time sufficient to etch either a sacrificial oxide (typically around 50 angstroms to 200 angstroms) or a native oxide (typically around 10 angstroms.) In some embodiments, the process time of the first stage of the cleaning process may be between about 20 seconds and about 50 seconds, about 40 seconds, or about 30 seconds. In some embodiments, the process time of the first stage of the cleaning process may be between about 1 minutes and about 5 minutes.

In some embodiments, the first cleaning solution may further include fluoride compound(s), organic acid salt(s), and/or glyoxylic acid.

The fluorine compound(s) may be contained in the first cleaning solution as a component for removing the residue (e.g., the etching residue ER). Examples of the fluorine compound(s) may include hydrofluoric acid and ammonium or amine fluoride salts such as, for example, ammonium fluoride, ammonium hydrogen fluoride, methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and triethylenediamine hydrofluoride. In some embodiments, the concentration of the fluorine compound(s) in the first cleaning solution may be determined according to the composition of the etching residue ER. For example, the concentration of the fluorine compound(s) may be between about 0.1 mass % and about 5 mass % of the entire composition of the first cleaning solution, or between about 0.2 mass 20% and about 3 mass % of the entire composition of the first cleaning solution.

The organic acid salt(s) may include, for example, ammonium oxalate, ammonium tartarate, ammonium citrate, and ammonium acetate. The organic acid salt(s) may act as a pH adjusting agent(s) or buffer agent(s) in the first cleaning solution. The concentration of the organic acid salt(s) may be between about 0.1 mass % and about 10 mass % of the entire composition of the first cleaning solution, or between about 0.3 mass % and about 5 mass % of the entire composition of the first cleaning solution.

The glyoxylic contained in the first cleaning solution may serve as a corrosion inhibitor.

In some embodiments, the first cleaning solution may further include a resist removal component. Examples of the resist removal component include tetramethylammonium hydroxide and/or monomethanolamine.

The first inter-stage rinse may be performed after the first stage of the cleaning process. During the first inter-stage rinse, the intermediate semiconductor device after the first stage of the cleaning process may be rotated at between about 10 rpm and about 1000 rpm while being rinsed with deionized water. In some embodiments, the rinse temperature may be between about 19° C. and about 23° C. In some embodiments, the process time of the first inter-stage rinse may be between about 20 seconds and about 50 seconds, or about 30 seconds.

In some embodiments, the deionized water used for the first inter-stage rinse may be oxygenated or ozonated by dissolving oxygen gas or ozone gas before rinsing the intermediate semiconductor device. Dissolved oxygen or ozone may be added to the deionized water in a concentration of greater than 1 ppm to serve as an oxidant. For example, the concentration of dissolved oxygen or ozone may be between about 1 ppm and about 200 ppm or between about 2 ppm and about 20 ppm. For another example, the deionized water may be saturated with dissolved oxygen or ozone. Alternatively, hydrogen peroxide may be added to the deionized water in a concentration of greater than 100 ppm to serve as an oxidant. Whichever oxidant is used, it should have an oxidation potential sufficient to oxidize the most noble metal in the solution. Copper ($Cu^{2+}$), with a standard reduction potential of 0.3V, is usually the most noble metal present. Therefore, a standard reduction potential of greater than 0.5V is desired. Oxygen or ozone will solvate the metal ions and prevent precipitation by oxidizing the metal ions that are in solution. This will help decrease the processing time by making the first inter-stage rinse more effective.

In some embodiments, the deionized water used for the first inter-stage rinse may carbon dioxide dissolved into it to dissipate static electricity that builds up in the deionized water. Static electricity builds up in the deionized water may originate from the rotation of the intermediate semiconductor device. The dissolved carbon dioxide may also make the deionized water more acidic and therefore reduces any metallic contamination. In some embodiments, carbon dioxide may be dissolved into the deionized water in an amount sufficient to dissipate static electricity. For example, the amount of carbon dioxide dissolved into the deionized water may be sufficient to decrease the resistivity of the deionized water to less than 5 Megaohm·cm.

In some embodiments, the deionized water used for the first inter-stage rinse may have isopropyl alcohol, or any other liquid with a surface tension lower than that of the deionized water, added to it. Isopropyl alcohol may aid by making the deionized water spread out over the front side of the intermediate semiconductor device so that the chemicals are removed more quickly. Isopropyl alcohol may also help the rinse spin off of the intermediate semiconductor device during spinning. Alternatively, isopropyl alcohol vapor may be blown onto the front side of the intermediate semiconductor device while rinsing to assist the first inter-stage rinse.

In some embodiments, the deionized water used to remove the pre-cleaning solution may have treatments similar to the deionized water used during the first inter-stage rinse.

In some embodiments, during the second stage of the cleaning process, the intermediate semiconductor device after the first inter-stage rinse may be spun at a rate between about 10 rpm and about 2000 rpm or between about 100 rpm and 1000 rpm. The second cleaning solution may be sprayed onto the intermediate semiconductor device to cover the entire front side of the intermediate semiconductor device. Simultaneously to applying the second cleaning solution onto the front side of the intermediate semiconductor device, water or other suitable solution may be applied to the backside of the intermediate semiconductor device to clean the backside of the intermediate semiconductor device.

In some embodiments, the second cleaning solution may be an alkaline solution including, for example, aqueous solutions of inorganic compounds such as sodium hydroxide, potassium hydroxide and ammonium hydroxide, and aqueous solution of organic compounds such as tetramethylammonium hydroxide and choline. The second cleaning solution may also include hydrogen peroxide. The purpose of the ammonium hydroxide and the hydrogen peroxide in the second cleaning solution is to remove particles and residual organic contaminates from the front side of the intermediate semiconductor device.

For example, in the present embodiment, the second cleaning solution may include ammonium hydroxide, hydrogen peroxide, and water. The ammonium hydroxide, hydrogen peroxide, and water may be present in concentrations defined by dilution ratios of between 5/1/1 to 1000/1/1, respectively. In some embodiments, the ammonium hydroxide/hydrogen peroxide ratio may be varied between 0.05/1 and 5/1. In some embodiments, no hydrogen peroxide is used at all. The ammonium hydroxide in the second cleaning solution would be from a solution of 28-29% w/w of ammonia to water. The hydrogen peroxide in the second cleaning solution would be from a solution of 31-32% w/w of hydrogen peroxide to water. The pH of the second cleaning solution may be between about 9 and 12 or between about 10 and 11 due to the ammonium hydroxide and the hydrogen peroxide.

In some embodiments, the second cleaning solution may further include chelating agent(s). The chelating agent(s) of the second cleaning solution may have compound(s) and concentration similar to the chelating agent(s) contained in the pre-cleaning solution, and descriptions thereof are not repeated herein.

In some embodiments, the second cleaning solution may further include surfactant(s). The surfactant (s) of the second cleaning solution may have compound(s) and concentration similar to the surfactant (s) contained in the pre-cleaning solution, and descriptions thereof are not repeated herein.

In some embodiments, the second cleaning solution may further include dissolved hydrogen gas. The dissolved hydrogen gas in the second cleaning solution may provide cavitation (bubble creation) to the second cleaning solution. Providing cavitation to the second cleaning solution may enhance the cleaning process. In some embodiments, the concentration of the dissolved hydrogen gas may be between about 0.01 mg/L and about 5 mg/L or between about 0.1 mg/L and about 5 mg/L. In some embodiments, other suitable cavitation gases such as nitrogen, helium, Argon, or oxygen may also be used. For example, dissolved oxygen having concentration between about 1 mg/L and about 20 mg/L may be used in the second cleaning solution.

In some embodiments, the process time of the second stage of the cleaning process may be between about 30 seconds and about 100 seconds, between about 30 seconds and 90 seconds, or between about seconds and about 60 seconds. In some embodiments, the temperature of the second cleaning solution may be between about 40° C. and about 85° C.

The second inter-stage rinse may be performed after the second stage of the cleaning process. The second inter-stage rinse may be performed with a procedure similar to the first inter-stage rinse, and descriptions thereof are not repeated herein.

In some embodiments, during the third stage of the cleaning process, the intermediate semiconductor device after the second inter-stage rinse may be spun at a rate between about 10 rpm and about 2000 rpm or between about 100 rpm and 1000 rpm. The third cleaning solution may be sprayed onto the intermediate semiconductor device to cover the entire front side of the intermediate semiconductor device. Simultaneously to applying the third cleaning solution onto the front side of the intermediate semiconductor device, water or other suitable solution may be applied to the backside of the intermediate semiconductor device to clean the backside of the intermediate semiconductor device.

In some embodiments, the third cleaning solution may be an acidic solution including, for example, aqueous solution of inorganic acids such as hydrochloric acid, hydrofluoric acid, sulfuric acid and nitric acid, and aqueous solution of organic acids such as oxalic acid, citric acid, malonic acid, malic acid, fumaric acid and maleic acid. In some embodiments, the third cleaning solution may also include hydrogen peroxide. The concentration of the acidic solution may be between about 0.001% and about 10% by weight or between about 0.01% and about 5% by weight. When the concentration is too low, the washing effect may not be obtained sufficiently. When the concentration is too high, metal-corrosion of the washing apparatus or the other related apparatus may occur.

A post-stage rinse may be performed after the third stage of the cleaning process. The post-stage rinse may be performed with a procedure similar to the first inter-stage rinse, and descriptions thereof are not repeated herein.

In some embodiments, the second stage and the third stage of the cleaning process may be optional. In other words, only the first stage of the cleaning process may be performed. In some embodiments, the third stage of the cleaning process may be optional. In other words, only the first stage and the second stage of the cleaning process may be performed.

Conventionally, the cleaning process may be performed solely using diluted hydrofluoric acid without any pre-cleaning treatment. The underlying conductive layer may be damaged to cause profile defects (e.g., undercuts) or electron migration after filling conductive material into the feature opening 105-1. In contrast, in the present embodiment, the underlying conductive layer may be protected by the chelating agent(s) and/or the corrosion inhibitor(s) contained in the pre-cleaning solution. As a result, the profile defects or electron migration may be reduced or avoided. Accordingly, the yield and the reliability of the resulting semiconductor device 1A may be improved.

With reference to FIG. 1 and FIGS. 6 to 8, at step S17, a barrier layer 111, an assisting blocking layer 113, and a conductive feature 115 may be sequentially formed in the feature opening 105-1.

Figure 6:
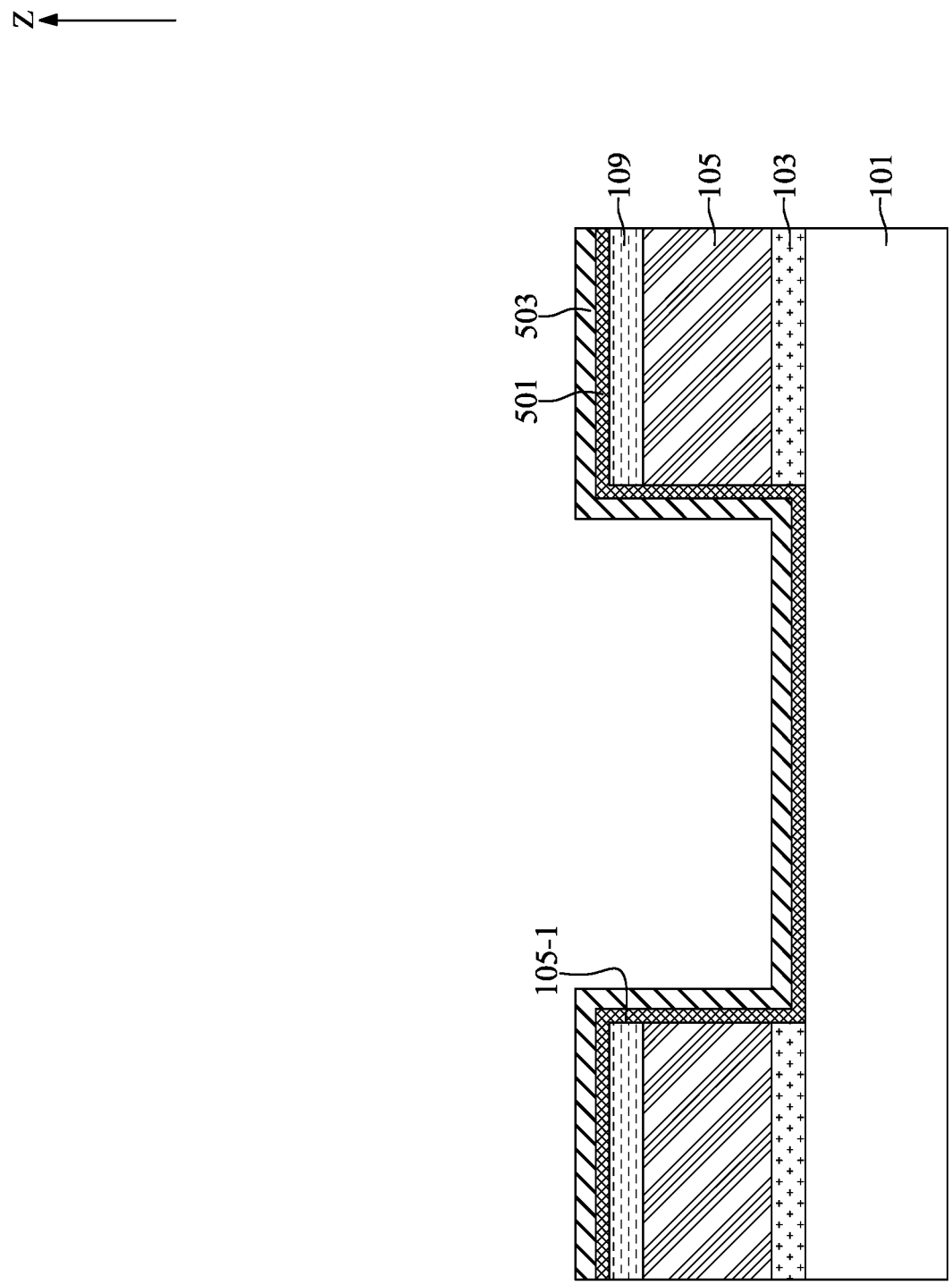

With reference to FIG. 6, a layer of first conductive material 501 may be conformally formed on the first hard mask layer 109 and in the inner surface of the feature opening 105-1 (i.e., the sidewall and the bottom surface of the feature opening 105-1). The first conductive material may be, for example, tantalum. The layer of first conductive material 501 may be formed by, for example, atomic layer deposition or other applicable deposition process.

With reference to FIG. 6, a layer of second conductive material 503 may be conformally formed on the layer of first conductive material 501. The second conductive material may be, for example, manganese. The layer of second conductive material 503 may be formed by, for example, atomic layer deposition or other applicable deposition process.

Figure 7:
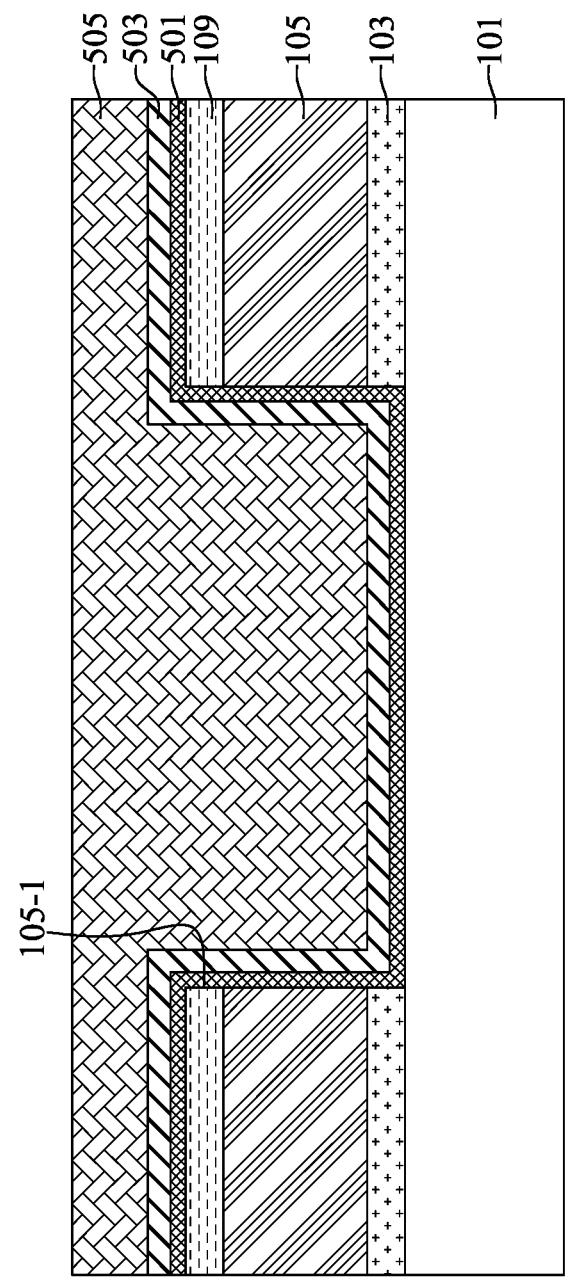

With reference to FIG. 7, a layer of third conductive material 505 may be formed on the layer of second conductive material 503 and may completely fill the feature opening 105-1. The third conductive material may be, for example, copper. The layer of third conductive material 505 may be formed by, for example, chemical vapor deposition, physical vapor deposition, sputtering, or other applicable deposition process. An annealing process may be performed after the formation of the layer of third conductive material 505. The annealing process may turn the manganese in the layer of second conductive material 503 into copper manganese alloy. The layer of copper manganese alloy may prevent copper diffusing to the first dielectric layer 105 or the substrate 101. As a result, the electron migration of the resulting semiconductor device 1A may be reduced.

Figure 8:
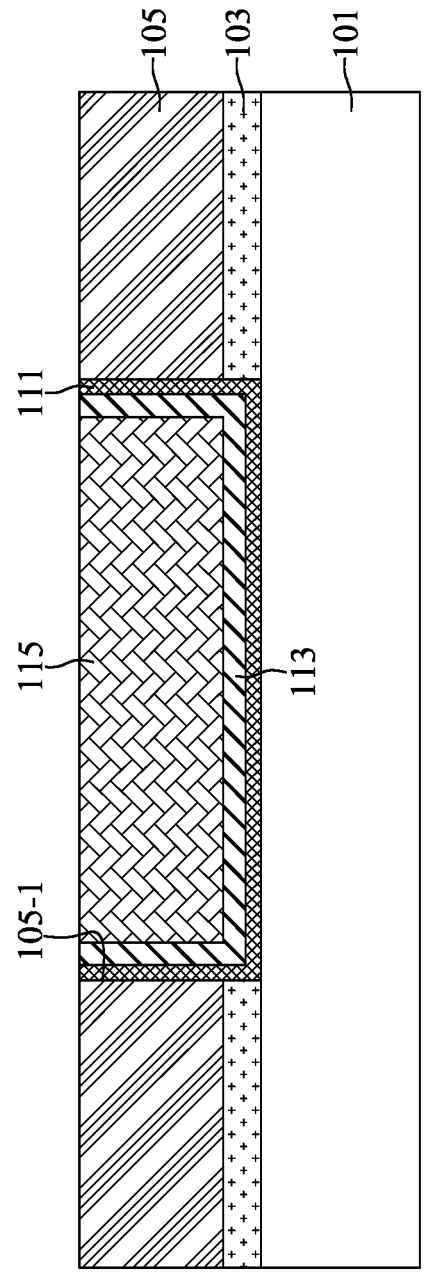

With reference to FIG. 8, a planarization process, such as chemical mechanical polishing, may be performed until the top surface of the first dielectric layer 105 is exposed to remove excess material and provide a substantially flat surface for subsequent processing steps. After the planarization process, the layer of first conductive material 501 may be turned into the barrier layer 111. The layer of second conductive material 503 may be turned into the assisting blocking layer 113. The layer of third conductive material 505 may be turned into the conductive feature 115.

With reference to FIG. 8, the substrate 101, the first etch stop layer 103, the first dielectric layer 105, the barrier layer 111, the assisting blocking layer 113, the conductive feature 115 may together configure the semiconductor device 1A.

Figure 9:
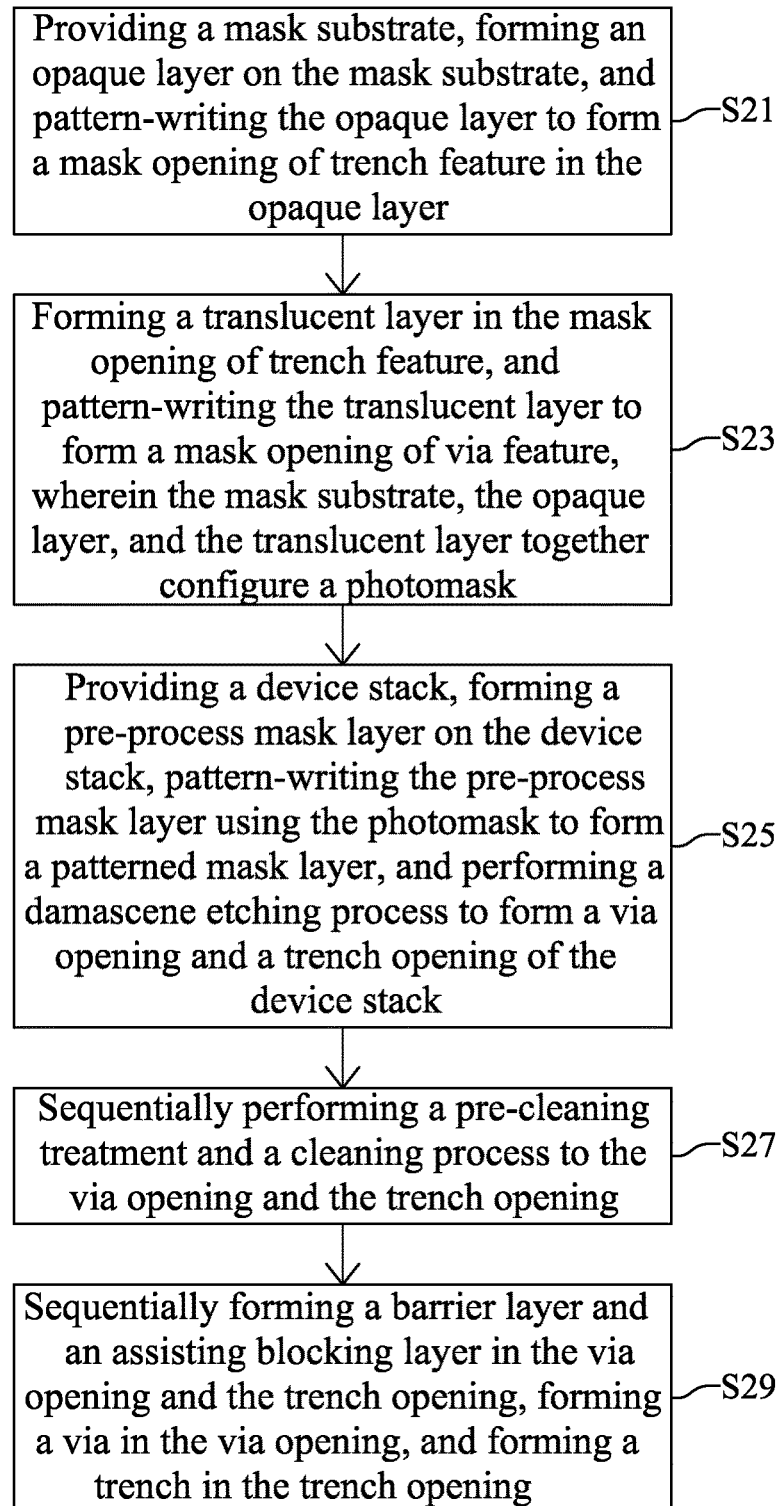
FIG. 9 illustrates, in a flowchart diagram form, a method for fabricating a semiconductor device in accordance with one embodiment of the present disclosure.

FIG. 9 illustrates, in a flowchart diagram form, a method 20 for fabricating a semiconductor device 1B in accordance with one embodiment of the present disclosure. FIGS. 10 to 22 illustrate, in schematic cross-sectional view diagrams, a flow for fabricating the semiconductor device 1B in accordance with one embodiment of the present disclosure.

Figure 10:
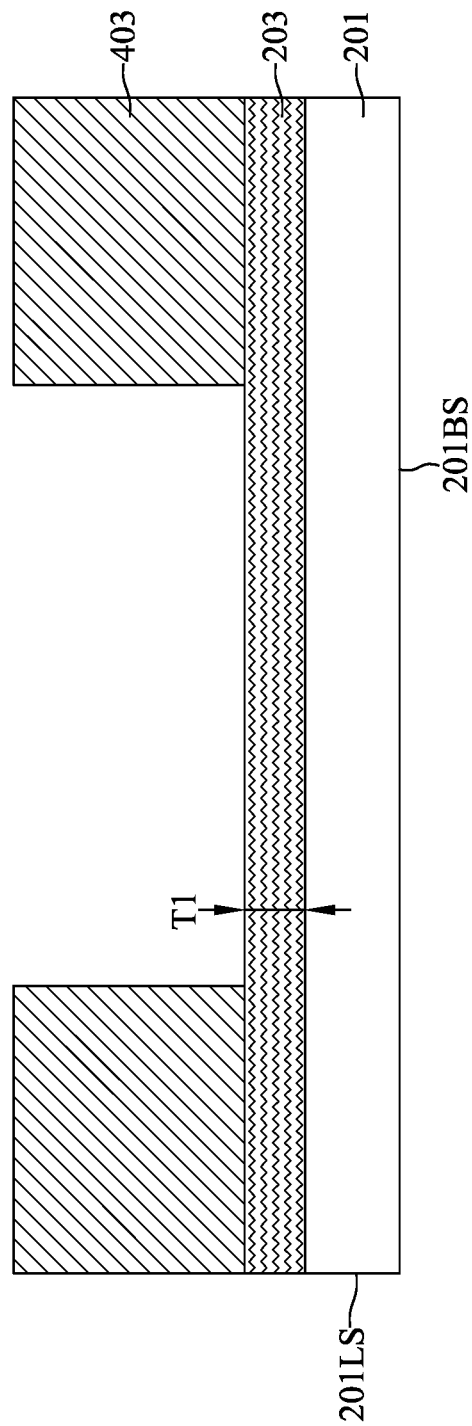
FIGS. 10 to 22 illustrate, in schematic cross-sectional view diagrams, a flow for fabricating the semiconductor device in accordance with one embodiment of the present disclosure.
Figure 11:
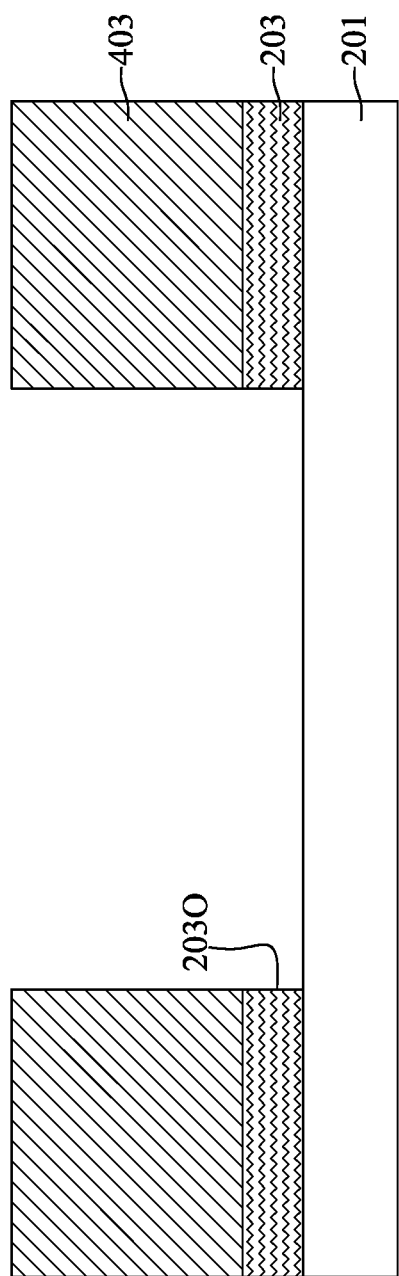

With reference to FIGS. 9 to 11, at step S21, a mask substrate 201 may be provided, an opaque layer 203 may be formed on the mask substrate 201, and the opaque layer 203 may be pattern-written to form a mask opening 203O of trench feature in the opaque layer 203.

With reference to FIG. 10, the mask substrate 201 may be formed of, for example, quartz, glass, or any other substantially transparent material. The glass may be, for example, aluminosilicate glass, calcium fluoride or magnesium fluoride and soda lime glass. In some embodiments, the thickness of the mask substrate 201 may be between about 0.125 inch and about 0.25 inch.

With reference to FIG. 10, the opaque layer 203 may be formed on the mask substrate 201. The opaque layer 203 may be formed of, for example, chrome or other suitable materials that is sufficiently opaque to an incident wavelength of an energy source of an exposure process of a photolithography process as will be illustrated later. In some embodiments, the opaque layer 203 may be formed by, for example, chemical vapor deposition, radio frequency sputtering, or other suitable deposition process. In some embodiments, the thickness T1 of the opaque layer 203 may be between about 500 Angstroms and about 1000 Angstroms. In some embodiments, the opacity of the opaque layer 203 may be 100% or substantially about 100%.

In some embodiments, alternatively, the opaque layer 203 may be formed by an electroplating process. Detailedly, the mask substrate 201 may be coated with a covering layer (not shown) on the bottom surface 201BS and the lateral surface 201LS of the mask substrate 201. Then, the mask substrate 201 coated with the covering layer may be soft baked to enhance the adhesion between the mask substrate 201 and the covering layer, and to drive off all solvent in the covering layer. Subsequently, the mask substrate 201 coated with the covering layer may be immersed in the electroless chrome plating activator for surface activation. Suitable electroless chrome plating activator may be an alkaline solution of chromium chloride and 2-propanol. The activated mask substrate 201 coated with the covering layer may be then immersed in the electroless chrome plating solution for being coated with the opaque layer 203. After the opaque layer 203 is formed on the mask substrate 201 coated with the covering layer, the covering layer may be stripped from the mask substrate 201.

With reference to FIG. 10, a second mask layer 403 may be formed on the opaque layer 203 by a photolithography process. The second mask layer 403 may include a pattern of the mask opening 203O of trench feature. In some embodiments, the second mask layer 403 may be a photoresist such as commercially available photoresist OCG895i or other suitable photoresists.

With reference to FIG. 11, a trench-etching process using the second mask layer 403 as a mask may be performed to remove a portion of the opaque layer 203. After the trench-etching process, the mask opening 203O of trench feature may be formed in the opaque layer 203. A first portion of the top surface of the mask substrate 201 may be exposed through the mask opening 203O of trench feature. In some embodiments, the etch rate ratio of the opaque layer 203 to the mask substrate 201 may be between about 100:1 and about 1.05:1, between about 15:1 and about 2:1, or between about 10:1 and about 2:1 during the trench-etching process. After the mask opening 203O of trench feature is formed, the second mask layer 403 may be removed.

With reference to FIG. 9 and FIGS. 12 to 14, at step S23, a translucent layer 205 may be formed in the mask opening 203O of trench feature, and the translucent layer 205 may be pattern-written to form the mask opening 205O of via feature, wherein the mask substrate 201, the opaque layer 203, and the translucent layer 205 together configure a photomask 200.

Figure 12:
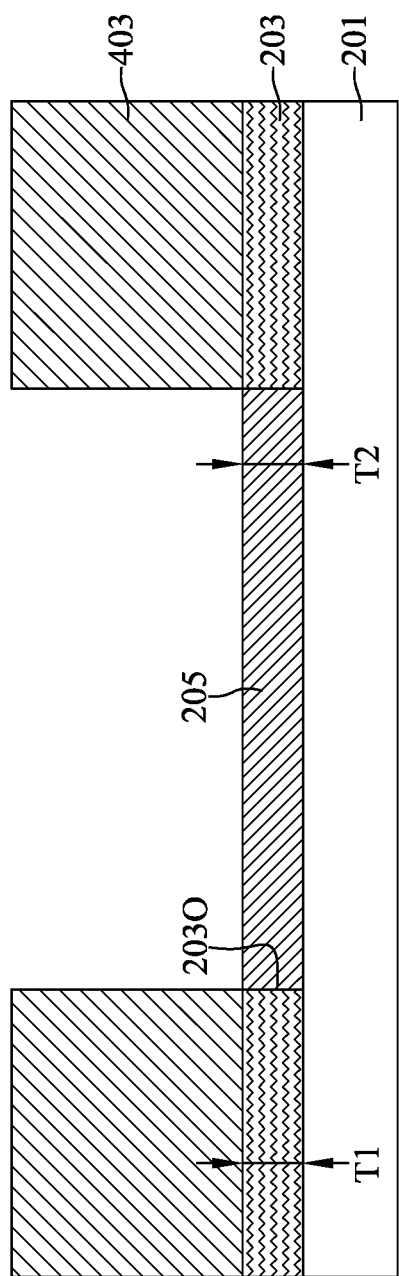

With reference to FIG. 12, the translucent layer 205 may include, for example, molybdenum silicide or silicon nitride. In some embodiments, the translucent layer 205 may be formed by, for example, chemical vapor deposition, sputtering, or other applicable deposition. In some embodiments, the second mask layer 403 may be removed after the formation of the translucent layer 205.

In some embodiments, the thickness T2 of the translucent layer 205 may be substantially the same as the thickness T1 of the opaque layer 203. In some embodiments, the thickness T2 of the translucent layer 205 and the thickness T1 of the opaque layer 203 may be different. For example, the thickness T2 of the translucent layer 205 may be greater than or less than the thickness T1 of the opaque layer 203. In some embodiments, the opacity ratio of the opacity of the translucent layer 205 to the opacity of the opaque layer 203 may be between about 5% and about 95%. In some embodiments, the opacity ratio of the opacity of the translucent layer 205 to the opacity of the opaque layer 203 may be between about 45% and about 75%. It should be noted that the exposed first portion of the top surface of the mask substrate 201 may be completely covered by the translucent layer 205 in the current stage.

Figure 13:
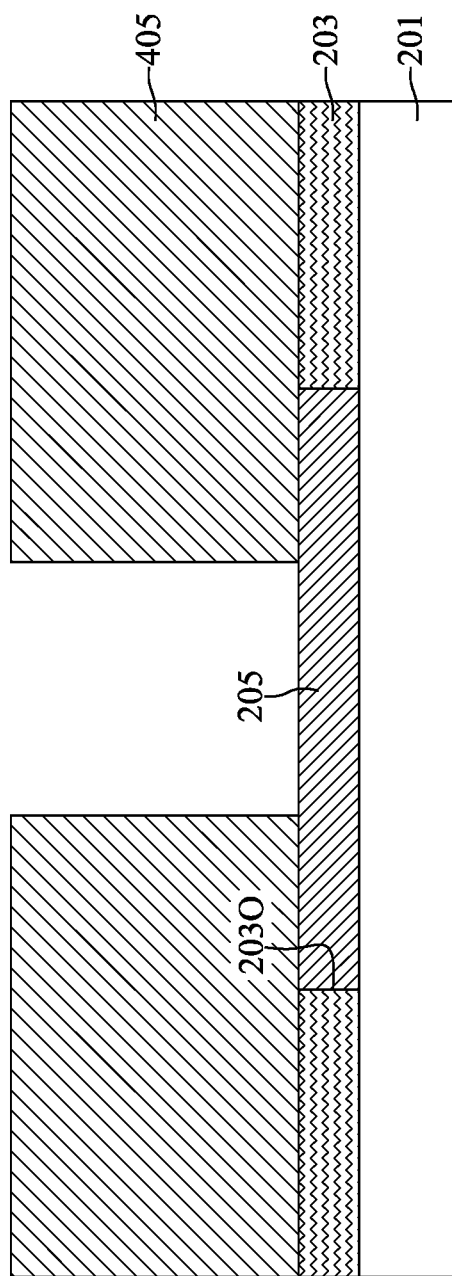

With reference to FIG. 13, a third mask layer 405 may be formed by a photolithography process to cover the opaque layer 203 and a portion of the translucent layer 205. The third mask layer 405 may include a pattern of the mask opening 205O of via feature. In some embodiments, the third mask layer 405 may be a photoresist such as commercially available photoresist OCG895i or other suitable photoresists.

Figure 14:
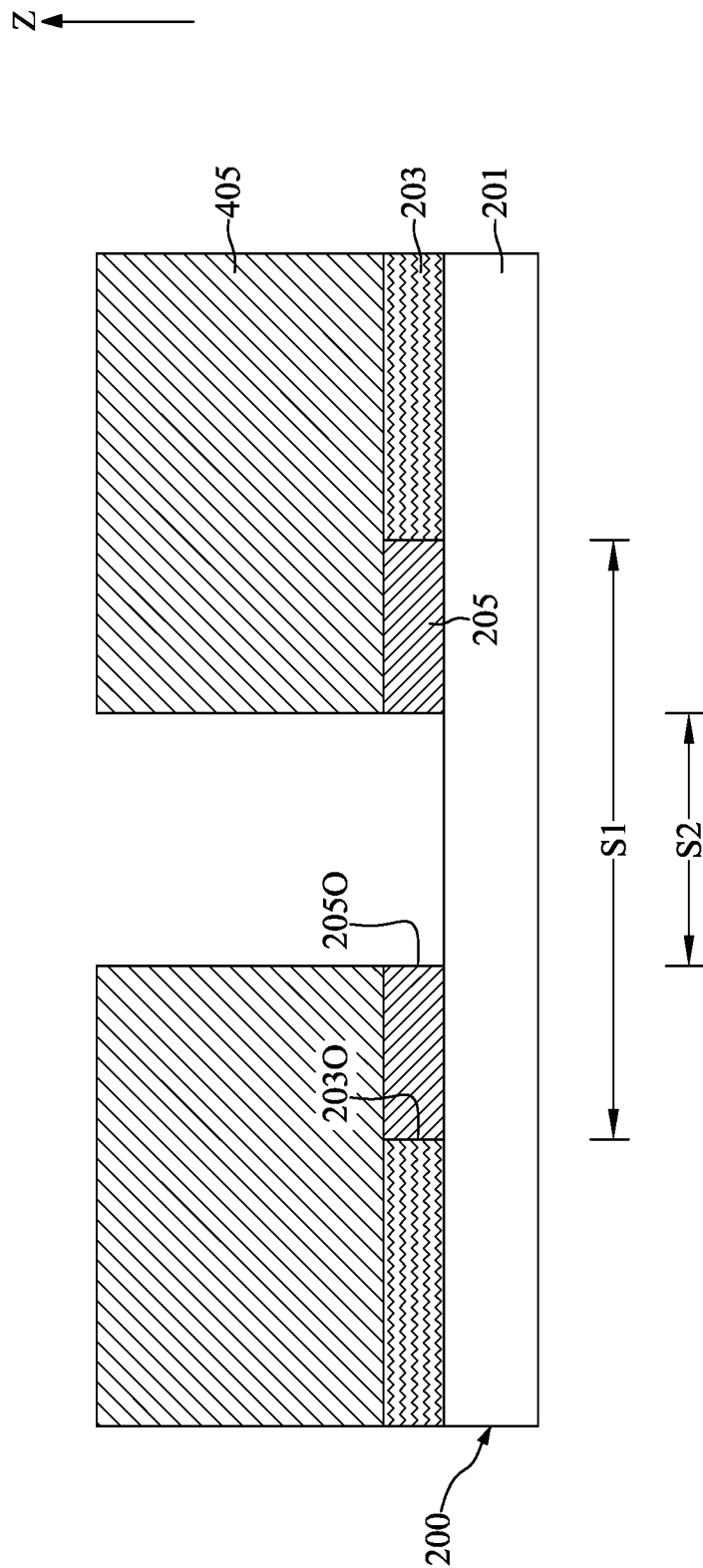

With reference to FIG. 14, a via-etching process using the second mask layer 303 as a mask may be performed to remove the exposed portion of the translucent layer 205. After the via-etching process, the mask opening 205O of via feature may be formed in the translucent layer 205. A second portion of the top surface of the mask substrate 201 may be exposed through the mask opening 205O of via feature. In some embodiments, the etch rate ratio of the translucent layer 205 to the mask substrate 201 may be between about 100:1 and about 1.05:1, between about 15:1 and about 2:1, or between about 10:1 and about 2:1 during the via-etching process. After the mask opening 205O of via feature is formed, the third mask layer 405 may be removed. The surface area S1 of the first portion of the top surface of the mask substrate 201 is greater than the surface area S2 of the second portion of the top surface of the mask substrate 201.

With reference to FIG. 9 and FIGS. 15 to 18, at step S25, a device stack SK may be provided, a pre-process mask layer 301 may be formed on the device stack SK, the pre-process mask layer 301 may be pattern-written using the photomask 200 to form a patterned mask layer 303, and a damascene etching process may be performed to form a via opening 105-3 and a trench opening 107-1 of the device stack SK.

Figure 15:
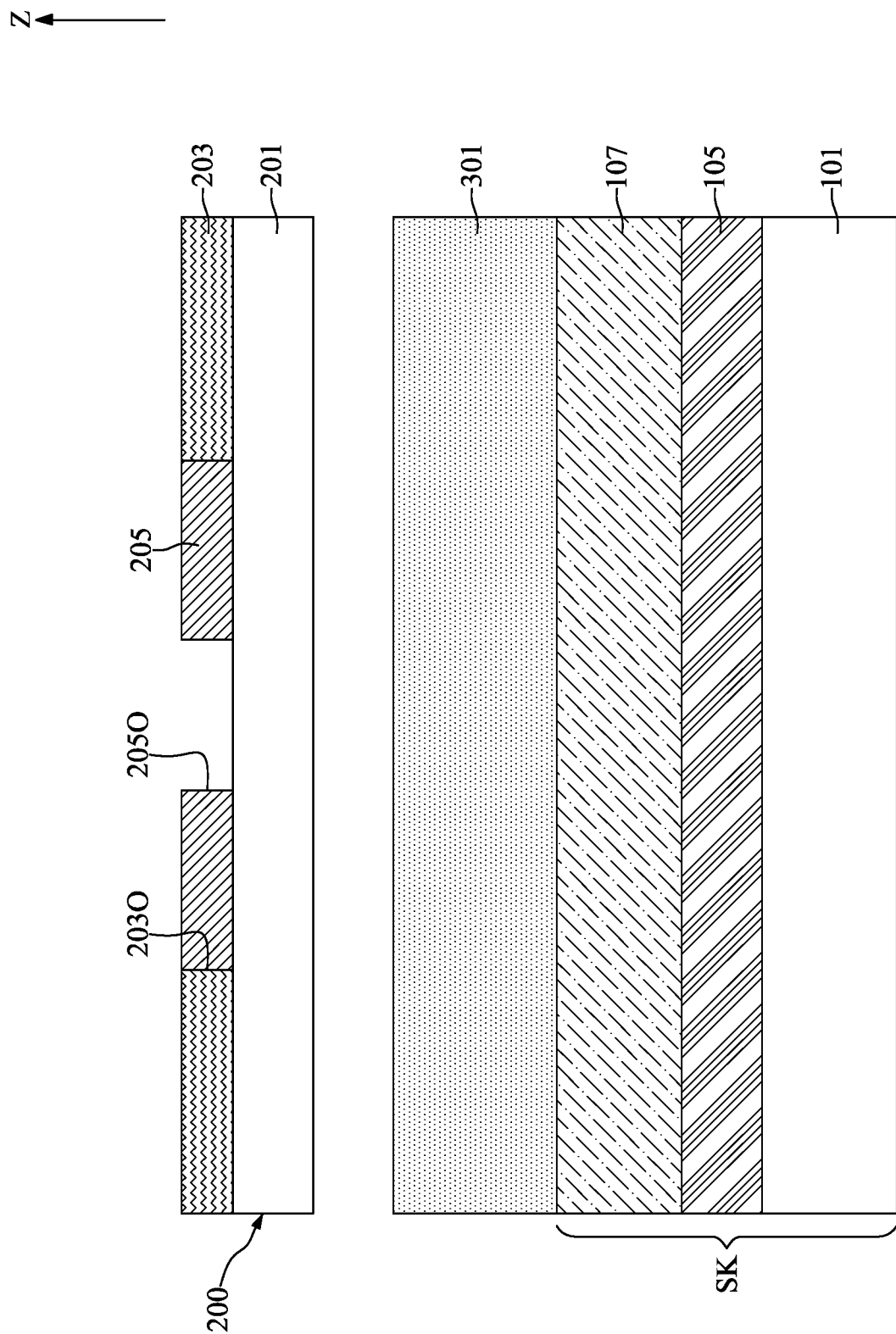

With reference to FIG. 15, the device stack SK may include a substrate 101, a first dielectric layer 105, and a second dielectric layer 107. The substrate 101 may have a structure similar to the substrate 101 illustrated in FIG. 2, and descriptions thereof are not repeated herein. The first dielectric layer 105 may be formed on the substrate 101. The first dielectric layer 105 may be formed with a procedure similar to the first dielectric layer 105 illustrated in FIG. 2, and descriptions thereof are not repeated herein. The second dielectric layer 107 may be formed on the first dielectric layer 203. The second dielectric layer 107 may be formed with a procedure similar to the first dielectric layer 105 illustrated in FIG. 2, and descriptions thereof are not repeated herein. In some embodiments, the thickness of the second dielectric layer 107 may be greater than the thickness of the first dielectric layer 105.

With reference to FIG. 15, the pre-process mask layer 301 may be formed on the second dielectric layer 107 by, for example, spin-on coating. A soft bake process may be performed to drive out solvent remaining in the pre-process mask layer 301. In some embodiments, the pre-process mask layer 301 may be a photoresist such as commercially available photoresist OCG895i or other suitable photoresists.

Figure 16:
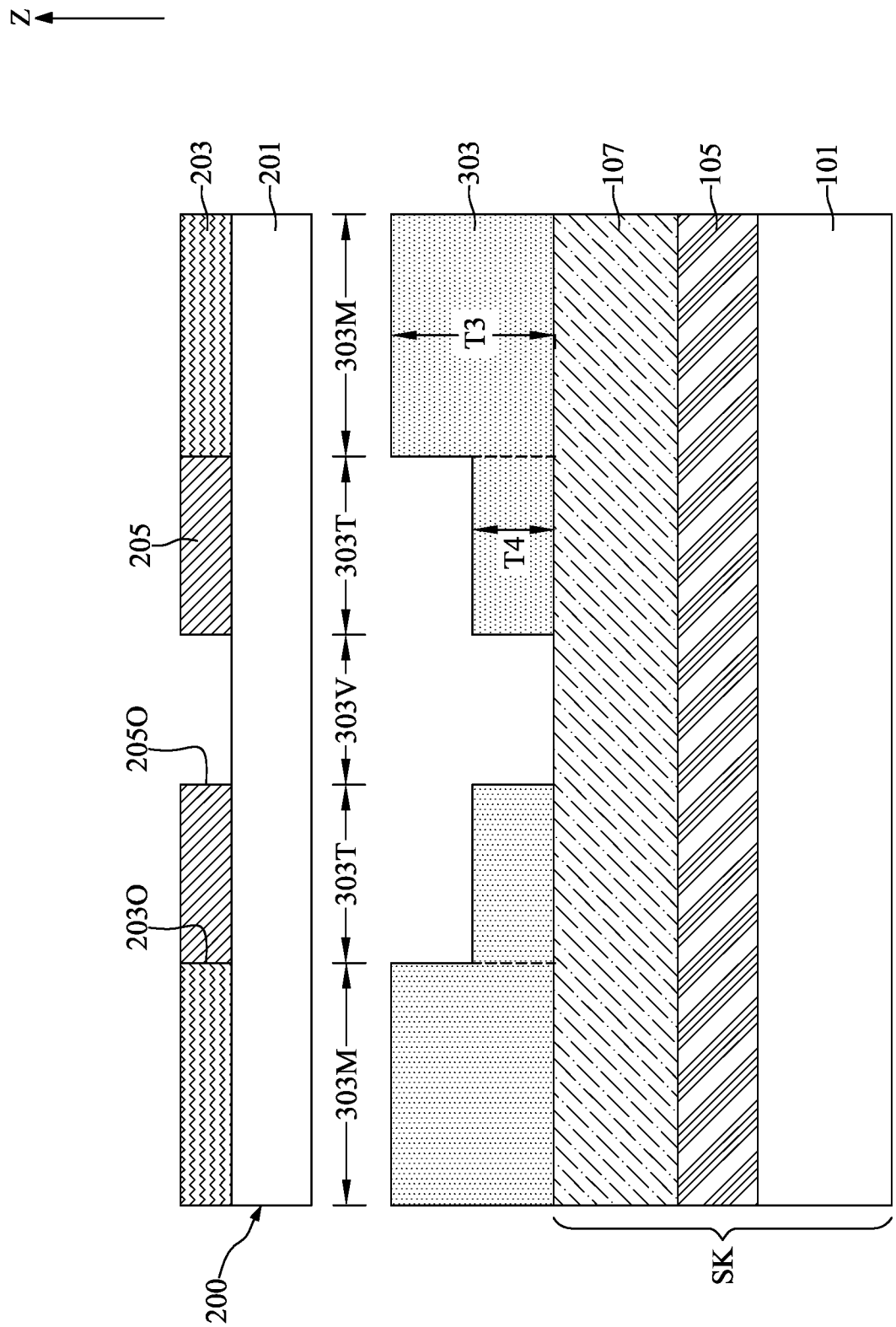

With reference to FIG. 16, the photomask 200 may be positioned over the device stack SK and align with the device stack SK. An exposure process may be performed using the photomask 200. The exposure process may be performed using a radiation source. The radiation source may be, for example, ultraviolet radiation, deep ultraviolet radiation (typically 193 nm or 248 nm), or extreme ultraviolet radiation (typically 13.5 nm). A post-exposure bake process may be immediately performed after the exposure process. Subsequently, a development process may be performed. During the development process, an aqueous base solution may be added to the exposed and baked pre-process mask layer 301, and a portion of the pre-process mask layer 301 may be dissolved. After the exposure process, the post-exposure bake process, and the development process, the pre-process mask layer 301 may be turned into the patterned mask layer 303.

With reference to FIG. 16, the patterned mask layer 303 may include a mask region 303M, a trench region 303T, and a via hole 303V. The mask region 303M may surround the trench region 303T. The mask region 303M may correspond to the opaque layer 203. That is, the mask region 303M and the opaque layer 203 may be completely overlapped to each other in a top-view perspective (not shown). The trench region 303T may correspond to the translucent layer 205. That is, the trench region 303T and the translucent layer 205 may be completely overlapped to each other in a top-view perspective (not shown). The space surrounded by the trench region 303T is referred to as the via hole 303V. A portion of the top surface of the second dielectric layer 107 may be exposed through the via hole 303V. The via hole 303V may correspond to the mask opening 205O of via feature. That is, the via hole 303V and the mask opening 205O of via feature may be completely overlapped to each other in a top-view perspective (not shown).

In some embodiments, the thickness T3 of the mask region 303M may be greater than the thickness T4 of the trench region 303T. In some embodiments, the thickness ratio of the thickness T4 of the trench region 303T to the thickness T3 of the mask region 303M may be between about 25% and about 85%. In some embodiments, the thickness ratio of the thickness T4 of the trench region 303T to the thickness T3 of the mask region 303M may be between about 45% and about 65%.

Figure 17:
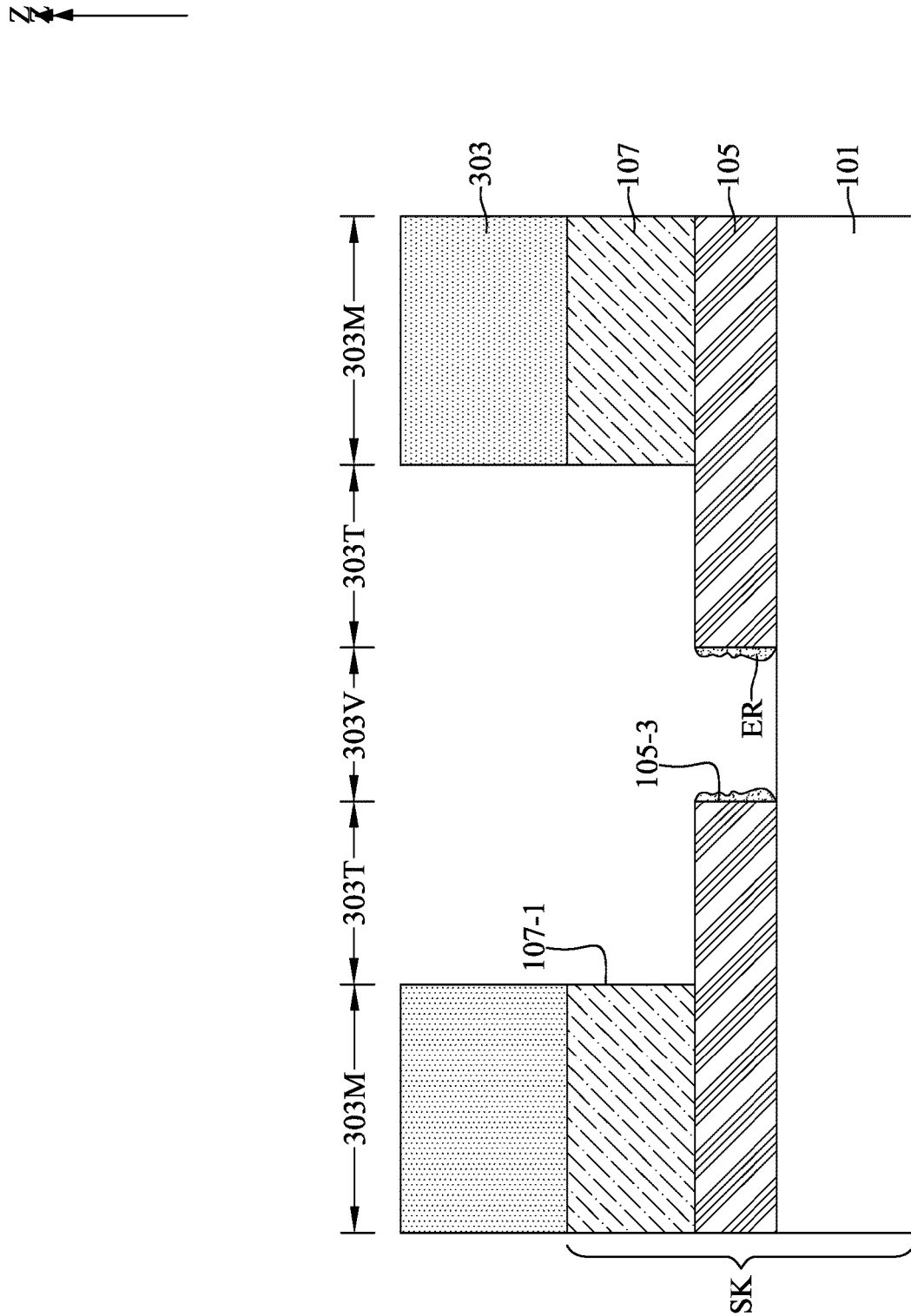

With reference to FIG. 17, the damascene etching process may be performed using the patterned mask layer 303 as a mask. In some embodiments, the etch rate of the first dielectric layer 105 and the etch rate of the second dielectric layer 107 during the damascene etching process may be substantially the same. In some embodiments, the etch rate ratio of the second dielectric layer 107 to the substrate 101 may be between about 100:1 and about 1.05:1, between about 15:1 and about 2:1, or between about 10:1 and about 2:1 during the damascene etching process. In some embodiments, the etch rate ratio of the first dielectric layer 105 to the substrate 101 may be between about 100:1 and about 1.05:1, between about 15:1 and about 2:1, or between about 10:1 and about 2:1 during the damascene etching process.

During the damascene etching process, the first dielectric layer 105 and the second dielectric layer 107 under the trench region 303T may be temporarily protected by the trench region 303T of the patterned mask layer 303. Detailedly, in the beginning of the damascene etching process, the trench region 303T of the patterned mask layer 303 may serve as an etching buffer to protect the underneath second dielectric layer 107. However, the trench region 303T of the patterned mask layer 303 may be continually consumed during the damascene etching process. After the trench region 303T of the patterned mask layer 303 is completely consumed, the second dielectric layer 107 corresponding to the trench region 303T is removed.

In contrast, for the first dielectric layer 105 and the second dielectric layer 107 corresponding to the via hole 303V of the patterned mask layer 303, no patterned mask layer 303 is present to serve as a temporary etching buffer. Hence, in beginning of the damascene etching process, the second dielectric layer 107 corresponding to the via hole 303V is removed while the second dielectric layer 107 corresponding to the trench region 303T is still protected by the trench region 303T of the patterned mask layer 303. As a result, after the damascene etching process, the first dielectric layer 105 and the second dielectric layer 107 corresponding to the via hole 303V may be both removed and only the second dielectric layer 107 corresponding to the trench region 303T may be removed. The first dielectric layer 105 corresponding to the trench region 303T is intact or slightly removed.

After the damascene etching process, the via opening 105-3 may be formed in the first dielectric layer 105. A portion of the substrate 101 may be exposed through the via opening 105-3. The trench opening 107-1 may be formed in the second dielectric layer 107. A portion of the first dielectric layer 105 and the portion of the substrate 101 may be exposed through the trench opening 107-1. The patterned mask layer 303 may be removed after the via opening 105-3 and the trench opening 107-1 are formed.

Conventionally, the via opening 105-3 and the trench opening 107-1 may be formed separately by using multiple etching steps. In contrast, in the present embodiment, the via opening 105-3 and the trench opening 107-1 may be formed by using a single damascene etching process due to the employment of the photomask 200 with the translucent layer 205.

Figure 18:
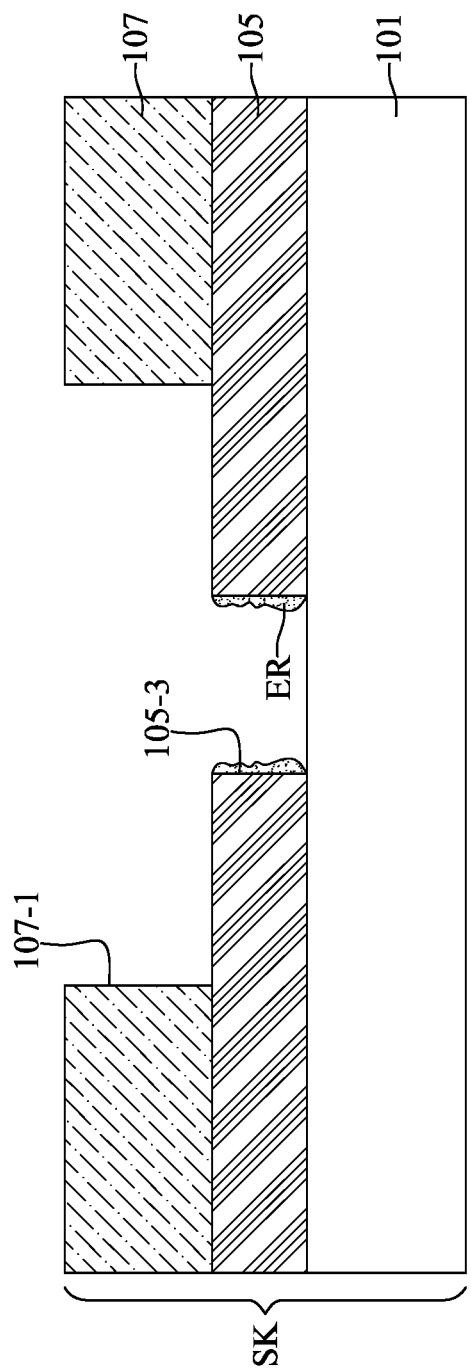

With reference to FIG. 18, the patterned mask layer 303 may be removed after the etching process for forming the via opening 105-3 and the trench opening 107-1. The removal of the patterned mask layer 303 may be achieved by an ashing process or other applicable processes. Some etching residue ER may be left after the removal of the patterned mask layer 303.

Figure 19:
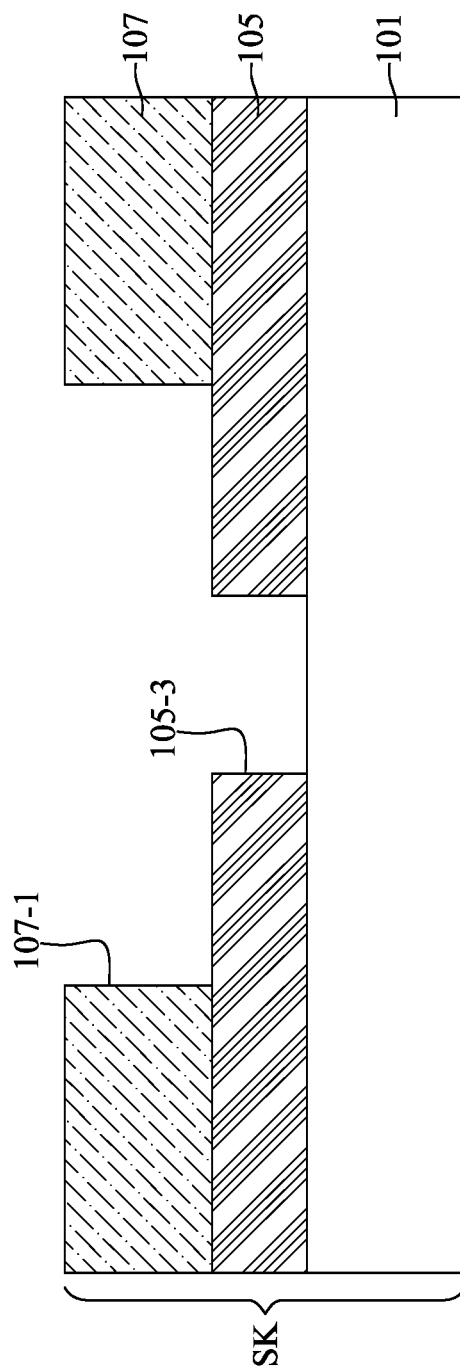

With reference to FIGS. 9 and 19, at step S27, a pre-cleaning treatment and a cleaning process may be sequentially performed to the via opening 105-3 and the trench opening 107-1.

With reference to FIG. 19, the pre-cleaning treatment may be performed with a procedure similar to that illustrated in FIG. 5, and descriptions thereof are not repeated herein. The cleaning process may be performed with a procedure similar to that illustrated in FIG. 5, and descriptions thereof are not repeated herein.

With reference to FIG. 9 and FIGS. 20 to 22, at step S29, a barrier layer 111 and an assisting blocking layer 113 may be sequentially formed in the via opening 105-3 and the trench opening 107-1, a via 117 may be formed in the via opening 105-3, and a trench 119 may be formed in the trench opening 107-1.

Figure 20:
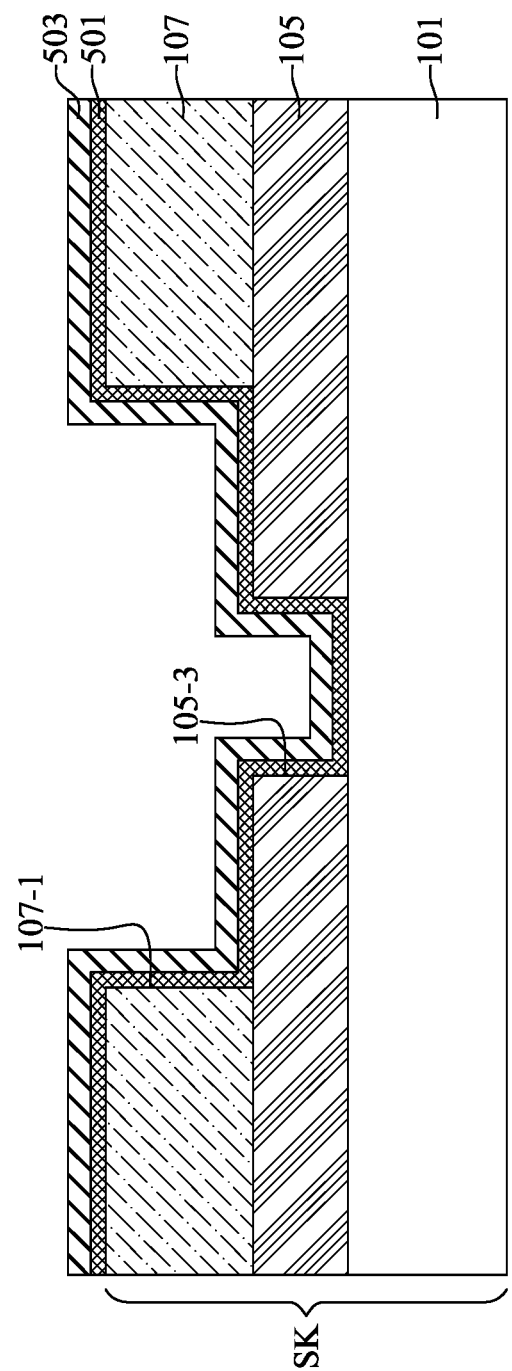

With reference to FIG. 20, a layer of first conductive material 501 may be conformally formed in the via opening 105-3 and the trench opening 107-1 with a procedure similar to that illustrated in FIG. 6, and descriptions thereof are not repeated herein. The layer of second conductive material 503 may be conformally formed on the layer of first conductive material 501 with a procedure similar to that illustrated in FIG. 6, and descriptions thereof are not repeated herein.

Figure 21:
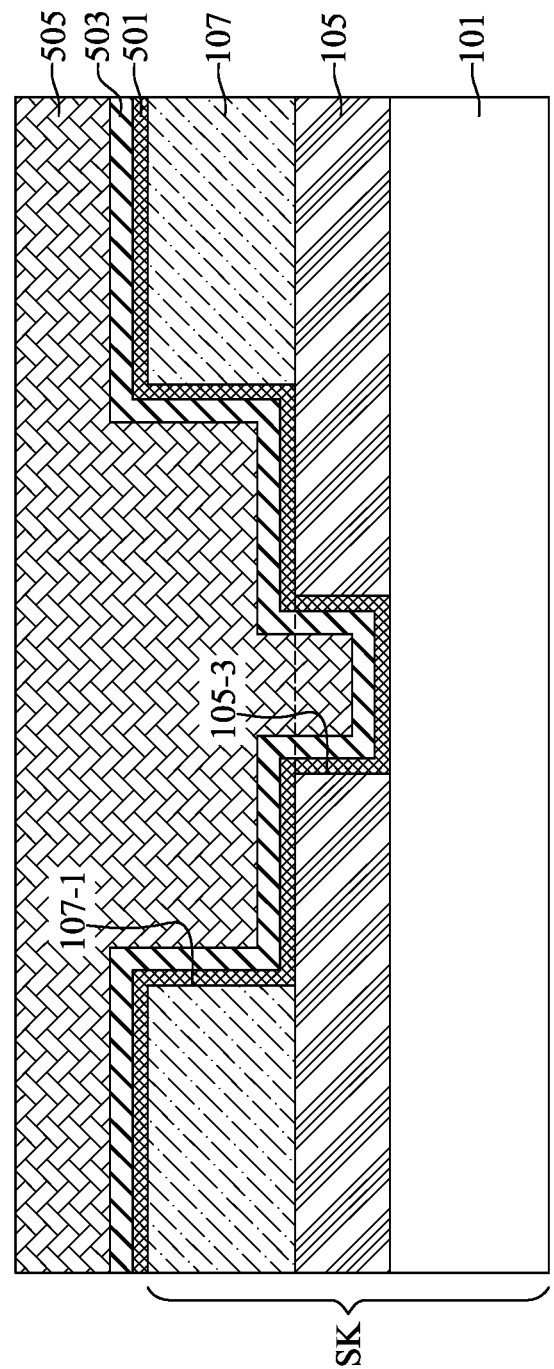

With reference to FIG. 21, a layer of third conductive material 505 may be formed on the layer of second conductive material 503 and completely fill the via opening 105-3 and the trench opening 107-1. The layer of third conductive material 505 may be formed with a procedure similar to that illustrated in FIG. 7, and descriptions thereof are not repeated herein.

Figure 22:
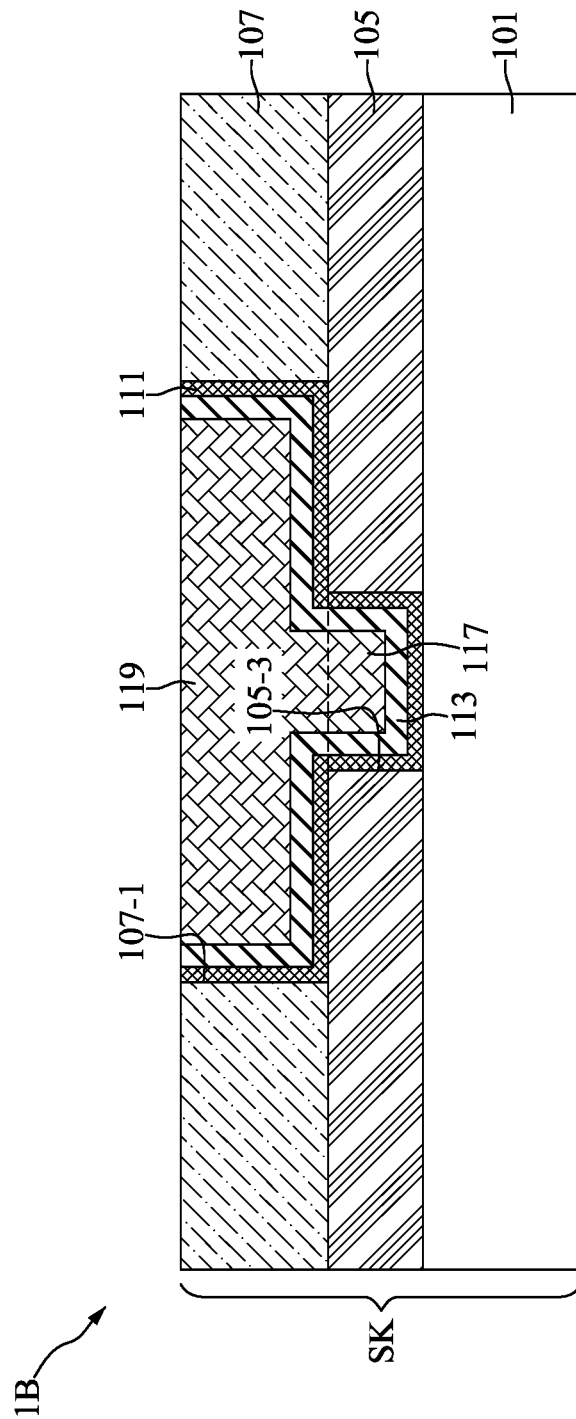

With reference to FIG. 22, a planarization process, such as chemical mechanical polishing, may be performed until the top surface of the second dielectric layer 107 is exposed to remove excess material and provide a substantially flat surface for subsequent processing steps. After the planarization process, the layer of first conductive material 501 may be turned into the barrier layer 111. The layer of second conductive material 503 may be turned into the assisting blocking layer 113. The layer of third conductive material 505 may be turned into the via 117 in the via opening 105-3 and the trench 119 in the trench opening 107-1.

With reference to FIG. 22, the substrate 101, the first dielectric layer 105, the second dielectric layer 107, the barrier layer 111, the assisting blocking layer 113, the via 117, and the trench 119 may together configure the semiconductor device 1B.

One aspect of the present disclosure provides a method for fabricating a semiconductor device including forming a first dielectric layer on a substrate; forming a feature opening to exposing the substrate; performing a pre-cleaning treatment including a pre-cleaning solution to the feature opening; performing a cleaning process to the feature opening; and forming a conductive feature in the feature opening. The pre-cleaning solution includes a chelating agent and a corrosion inhibitor.

Another aspect of the present disclosure provides a method for fabricating a semiconductor device including forming a first dielectric layer on a substrate; forming a feature opening to exposing the substrate; performing a pre-cleaning treatment including a pre-cleaning solution to the feature opening; performing a cleaning process to the feature opening; conformally forming a barrier layer in the feature opening; conformally forming an assisting blocking layer on the barrier layer; and forming a conductive feature on the assisting blocking layer. The pre-cleaning solution includes a chelating agent and a corrosion inhibitor. The barrier layer includes tantalum. The assisting blocking layer includes copper manganese alloy.

Another aspect of the present disclosure provides a pre-cleaning solution used before a cleaning process of a feature opening of a semiconductor device including a chelating agent including ethylenediaminetetraacetic acid, polyacrylates, carbonates, phosphonates, gluconates, N,N'-bis(2-hydroxyphenyl)ethylenediiminodiacetic acid, triethylenetetranitrilohexaacetic acid, desferriferrioxamin B, N, N',N"-tris[2-(N-hydroxycarbonyl)ethyl]-1,3, 5-benzenetricarboxamide, or ethylenediaminediorthohydroxyphenylacetic acid; a corrosion inhibitor including an aliphatic alcohol compound having at least one mercapto group; an amine fluoride including methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and/or triethylenediamine hydrofluoride; a surfactant including polyoxyethylene butylphenyl ether, polyoxyethylene alkylphenyl sulfate, or a combination thereof; and a solvent including deionized water.

Due to the design of the method for fabricating the semiconductor device of the present disclosure, the underlying conductive layer exposed through the feature opening 105-1 may be protected by the chelating agent(s) and/or the corrosion inhibitor(s) contained in the pre-cleaning solution. As a result, the profile defects or electron migration may be reduced or avoided. Accordingly, the yield and the reliability of the resulting semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   forming a first etch stop layer on a top surface of a substrate;
   forming a first dielectric layer on a top surface of the first etch stop layer;
   forming a first hard mask layer on a top surface of the first dielectric layer;
   forming a first mask layer on a top surface of the first hard mask layer;
   via the first mask layer, patterning the first hard mask layer to form a first hard mask opening so as to expose a portion of the top surface of the first dielectric layer, wherein a pattern of the first mask layer matches a width of the first hard mask opening;

via an ashing process, removing the first mask layer on the first hard mask layer after the first hard mask opening is formed to expose the top surface of the first hard mask layer;

after removing the first mask layer, forming a feature opening, via an etching process for etching the first dielectric layer, to expose the top surface of the substrate to remove a portion of the first dielectric layer and by removing a portion of the first etch stop layer, such that a width of the feature opening through the first dielectric layer is equal to a width of the feature opening through the first etch stop layer, wherein the width of the feature opening is equal to a width of the first hard mask opening, wherein a bottom wall of the feature opening is formed on the top surface of the substrate, wherein etching residues are left on inner surfaces of the feature opening and the top surface of the substrate after the ashing process to remove the first mask layer and the etching process to etch the first dielectric layer;

performing a pre-cleaning treatment comprising a pre-cleaning solution to the first hard mask opening and the feature opening for cleaning the etching residues therein at the same time, wherein the pre-cleaning treatment comprises:

applying the pre-cleaning solution into the first hard mask opening and the feature opening for a predetermined time;

rinsing the first hard mask opening and the feature opening by deionized water to remove the pre-cleaning solution;

performing a cleaning process to the first hard mask opening and the feature opening;

conformally forming a barrier layer in the first hard mask opening and the feature opening, wherein a bottom surface of the barrier layer is in contact with the top surface of the substrate, such that a height of the barrier layer is equal to a sum of a thickness of the first etch stop layer and a thickness of the first dielectric layer;

conformally forming an assisting blocking layer on the barrier layer; and forming a conductive feature on the assisting blocking layer, wherein a top surface of the barrier layer, a top surface of the assisting blocking layer, a top surface of the conductive feature are coplanar with a top surface of the first dielectric layer;

wherein the pre-cleaning solution comprises a chelating agent and a corrosion inhibitor to reduce a metal corrosion during the cleaning process;

wherein the barrier layer comprises tantalum;

wherein the assisting blocking layer comprises copper manganese alloy.

2. The method for fabricating the semiconductor device of claim 1, between the pre-cleaning process and the cleaning process, further comprising:

drying the first hard mask opening and the feature opening;

wherein the etching residues are an incompletely ashed substance remaining on the inner surface of the feature opening after the ashing process, and a polymer remaining on the inner surface of the feature opening.

3. The method for fabricating the semiconductor device of claim 1, wherein the cleaning process comprises:

during a first stage of the cleaning process, applying a first cleaning solution to the first hard mask opening and the feature opening, wherein the first cleaning solution comprises diluted hydrofluoric acid;

rinsing the first cleaning solution from the first hard mask opening and the feature opening;

during a second stage of the cleaning process, applying a second cleaning solution to the first hard mask opening and the feature opening, wherein the second cleaning solution comprises ammonium hydroxide, hydrogen peroxide, and water;

rinsing the second cleaning solution from the first hard mask opening and the feature opening;

during a third stage of the cleaning process, applying a third cleaning solution to the first hard mask opening and the feature opening, wherein the third cleaning solution comprises an acidic solution; and rinsing the third cleaning solution from the first hard mask opening and the feature opening.

4. The method for fabricating the semiconductor device of claim 1, after the cleaning process is performed, further comprising:

conformally forming a layer of first conductive material on the first hard mask layer and in an inner surface of the feature opening, wherein the layer of first conductive material is in contact with the top surface of the substrate;

conformally forming a layer of second conductive material on the layer of first conductive material;

forming a layer of third conductive material on the layer of second conductive material and completely filling the feature opening; and preforming a planarization process to remove the first hard mask layer, a portion of the layer of first conductive material, a portion of the layer of second conductive material, and a portion of the layer of third conductive material above the top surface of the first dielectric layer;

wherein after the planarization process, the layer of first conductive material turns into the barrier layer, the layer of second conductive material turns into the assisting blocking layer, and the layer of third conductive material turns into the conductive feature.

5. The method for fabricating the semiconductor device of claim 1, wherein the etching process for forming the feature opening comprises a first stage and a second stage, wherein an etch rate ratio of first dielectric layer to the first hard mask layer during the first stage of the etching process is different from an etch rate ratio of first dielectric layer to the first hard mask layer during the second stage of the etching process.

6. The method for fabricating the semiconductor device of claim 5, wherein a concentration of the chelating agent is between about 0.001 mg/L and about 300 mg/L.

7. The method for fabricating the semiconductor device of claim 6, wherein the corrosion inhibitor comprises an aliphatic alcohol compound having at least one mercapto group.

8. The method for fabricating the semiconductor device of claim 7, wherein a concentration of the corrosion inhibitor is between about 0.0001% and about 10% by weight.

9. The method for fabricating the semiconductor device of claim 8, wherein performing the cleaning process comprising spraying a first cleaning solution over the feature opening, and the first cleaning solution comprises diluted hydrofluoric acid.

10. The method for fabricating the semiconductor device of claim 9, wherein the pre-cleaning solution comprises amine fluoride.

11. The method for fabricating the semiconductor device of claim 10, wherein the amine fluoride comprises methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and/or triethylenediamine hydrofluoride.

12. The method for fabricating the semiconductor device of claim 11, wherein a concentration of the amine fluoride is between about 0.1 mass % and about 5 mass % of the entire composition of the pre-cleaning solution.

\* \* \* \* \*